United States Patent
Hiroki et al.

(10) Patent No.: US 7,674,635 B2
(45) Date of Patent: Mar. 9, 2010

(54) METHOD OF MANUFACTURING A SEMICONDUCTOR DEVICE

(75) Inventors: Masaaki Hiroki, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 11/496,310

(22) Filed: Jul. 31, 2006

(65) Prior Publication Data

US 2006/0263952 A1     Nov. 23, 2006

Related U.S. Application Data

(62) Division of application No. 10/102,277, filed on Mar. 18, 2002, now Pat. No. 7,105,365.

(30) Foreign Application Priority Data

Mar. 19, 2001   (JP)   ............................... 2001-079609

(51) Int. Cl.
*H01L 21/66* (2006.01)
(52) U.S. Cl. ..................... 438/14; 438/17; 438/149; 257/E21.524
(58) Field of Classification Search ............... 438/14, 438/17, 149–156; 257/E21.524
See application file for complete search history.

(56) References Cited

U.S. PATENT DOCUMENTS

| | | | |
|---|---|---|---|
| 3,311,818 A | 3/1967 | Quittner | |
| 4,983,911 A | 1/1991 | Henley | |
| 5,097,201 A | 3/1992 | Henley | |
| 5,124,635 A | 6/1992 | Henley | |
| 5,266,869 A * | 11/1993 | Usami | ............... 315/170 |
| 5,424,633 A * | 6/1995 | Soiferman | ............... 324/158.1 |
| 5,428,521 A | 6/1995 | Kigawa et al. | ............... 363/22 |
| 5,517,110 A | 5/1996 | Soiferman | |
| 5,543,729 A | 8/1996 | Henley | |
| 5,631,818 A * | 5/1997 | Johnson et al. | ............... 363/126 |

(Continued)

FOREIGN PATENT DOCUMENTS

DE     100 15 484 A1     10/2001

(Continued)

OTHER PUBLICATIONS

Aoshima, S. et al, "Improvement of the Minimum Detectability of Electro-Optic Sampling by Using a Structurally New Probe," OSA Proceedings on Picosecond Electronics and Optoelectronics, vol. 9, pp. 64-69, (1991).

(Continued)

*Primary Examiner*—H. Jey Tsai
(74) *Attorney, Agent, or Firm*—Cook Alex Ltd.

(57) ABSTRACT

The present invention supplies a manufacturing method of a semiconductor device, which includes a non-contact inspection process capable of confirming if a circuit or circuit element formed on an array substrate is normally performed and can decrease a manufacturing cost by eliminating wastes to keep a defective product forming.

An electromotive force generated by electromagnetic induction is rectified and shaped by using primary coils formed on a check substrate and secondary coils formed on an array substrate, whereby a power source voltage and a driving signal are supplied to circuits or circuit elements on a TFT substrate so as to be driven.

30 Claims, 24 Drawing Sheets

U.S. PATENT DOCUMENTS

| | | | |
|---|---|---|---|
| 5,643,804 A | 7/1997 | Arai et al. | |
| 5,837,971 A * | 11/1998 | Lee | 219/212 |
| 5,854,492 A | 12/1998 | Chinone et al. | 257/31 |
| 6,184,696 B1 * | 2/2001 | White et al. | 324/750 |
| 6,236,383 B1 | 5/2001 | Nakajima et al. | 345/87 |
| 6,249,673 B1 * | 6/2001 | Tsui | 455/92 |
| 6,294,909 B1 | 9/2001 | Leedy | |
| 6,321,067 B1 | 11/2001 | Suga et al. | |
| 6,365,917 B1 | 4/2002 | Yamazaki | |
| 6,407,546 B1 | 6/2002 | Le et al. | |
| 6,410,960 B1 | 6/2002 | Arai et al. | 257/347 |
| 6,427,065 B1 | 7/2002 | Suga et al. | |
| 6,496,166 B1 | 12/2002 | Onozawa et al. | 345/60 |
| 6,512,482 B1 | 1/2003 | Nelson et al. | |
| 6,686,755 B2 | 2/2004 | White et al. | |
| 6,753,257 B2 | 6/2004 | Yamazaki | |
| 6,759,850 B2 | 7/2004 | Harzanu et al. | |
| 6,850,080 B2 | 2/2005 | Hiroki | |
| 6,891,391 B2 | 5/2005 | Hiroki | |
| 6,930,047 B2 | 8/2005 | Yamazaki et al. | |
| 6,930,744 B1 | 8/2005 | Ukita | |
| 6,949,767 B2 | 9/2005 | Yamazaki | |
| 6,999,154 B2 | 2/2006 | Choo et al. | |
| 7,009,405 B2 | 3/2006 | Bae et al. | |
| 7,250,781 B2 | 7/2007 | Nakagawa et al. | |
| 7,256,055 B2 | 8/2007 | Aghababazadeh et al. | |
| 7,276,929 B2 | 10/2007 | Arai et al. | |
| 7,378,837 B2 | 5/2008 | Andarawis et al. | |
| 2002/0084967 A1 * | 7/2002 | Akimoto et al. | 345/90 |
| 2002/0085138 A1 * | 7/2002 | Kim et al. | 349/43 |
| 2002/0130675 A1 | 9/2002 | Hiroki | 324/750 |
| 2002/0167303 A1 | 11/2002 | Nakano | |
| 2002/0173060 A1 | 11/2002 | Hiroki | 438/17 |
| 2003/0146771 A1 | 8/2003 | Moore | 324/765 |
| 2005/0057242 A1 | 3/2005 | Swain | |
| 2005/0212044 A1 | 9/2005 | Hiroki | |
| 2005/0218926 A1 | 10/2005 | Hiroki | |
| 2006/0091387 A1 | 5/2006 | Yamazaki | |
| 2008/0024156 A1 | 1/2008 | Arai et al. | |

FOREIGN PATENT DOCUMENTS

| | | |
|---|---|---|
| EP | 1 005 093 A2 | 5/2000 |
| JP | 61-226887 | 10/1986 |
| JP | 1-297626 | 11/1989 |
| JP | 3-244141 | 10/1991 |
| JP | 4-138584 | 5/1992 |
| JP | 4-264745 | 9/1992 |
| JP | 5-119356 | 5/1993 |
| JP | 5-264461 | 10/1993 |
| JP | 5-314786 | 11/1993 |
| JP | 06-349913 | 12/1994 |
| JP | 7-142253 | 6/1995 |
| JP | 8-101404 | 4/1996 |
| JP | 9-325371 | 12/1997 |
| JP | 11-44724 | 2/1999 |
| JP | 11-353433 | 12/1999 |
| JP | 2000-200053 | 7/2000 |
| JP | 2000-223714 | 8/2000 |
| JP | 2000-258482 | 9/2000 |
| WO | WO 91/12534 A1 | 8/1991 |
| WO | WO 91/12536 A1 | 8/1991 |
| WO | WO 92/15021 A1 | 9/1992 |
| WO | WO 99/32893 | 7/1999 |
| WO | WO 01/88976 A2 | 11/2001 |
| WO | WO 02/063675 A1 | 8/2002 |

OTHER PUBLICATIONS

Takahashi, H. et al, "Improvement of Space-Dependent Sensitivity and Absolute Voltage Measurement in Noncontract Picosecond Electro-Optic Sampling," OSA Proceedings on Picosecond Electronics and Optoelectronics, vol. 9, pp. 70-74, (1991).

Aoshima, S. et al, "Internal Test of MMIC with E-O Sampling,". 1993 Microwave Workshops and Exhibition, Microwave Workshop Digest, pp. 77-82, (1993).

Hui, S.Y. et al, "Coreless Printed Circuit Board (PCB) Transformers—Fundamental Characteristics and Application Potential," IEEE Circuits and Systems, vol. 11, No. 3, pp. 3-15, Third Quarter, (2000).

Finkenzeller, K., RFID Handbook p. 35, Taihei Kanno, pub. Nikkan Kogyo Shimbum, Tokyo, Japan, Feb. 26, (2001); with English translation pp. 1-3.

PTO Office Action re U.S. Appl. No. 10/100,668, mailed Jan. 7, 2004.

Australian Patent Office search report re Singapore application No. SG 200201419-9. (counterpart application to present case), dated Mar. 3, 2004.

* cited by examiner

FIG. 4A check substrate
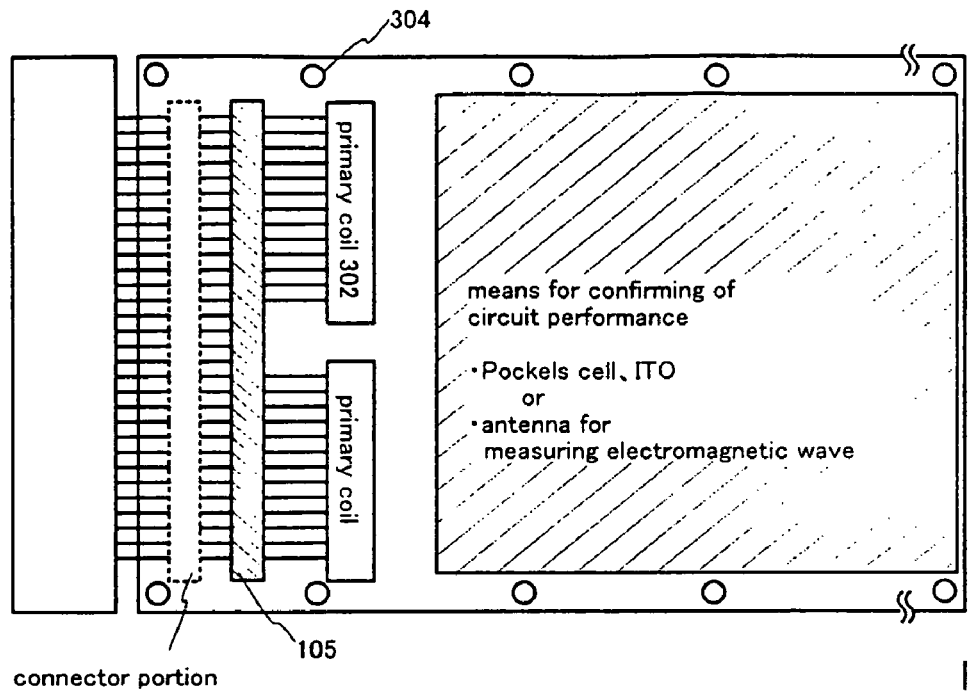
FIG. 4B array substrate
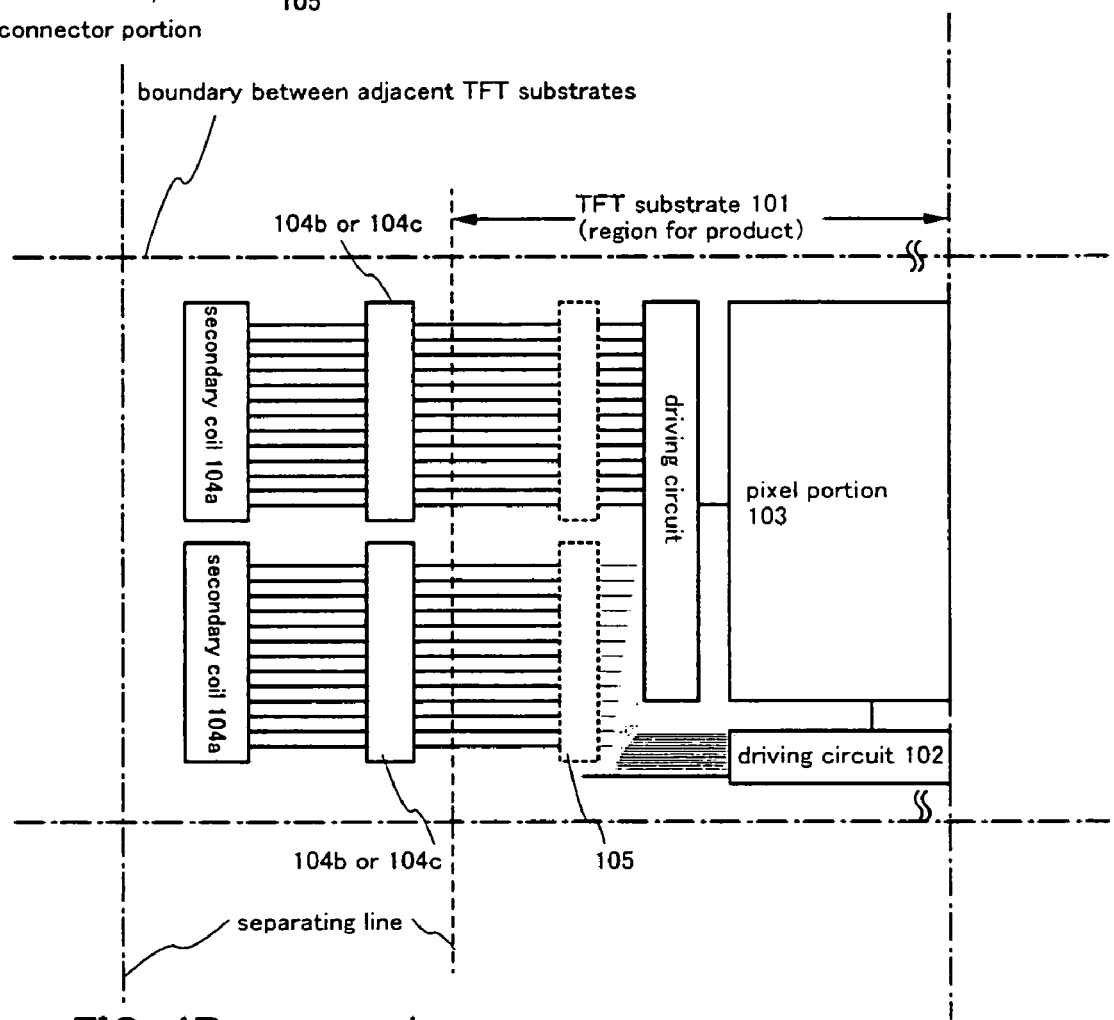

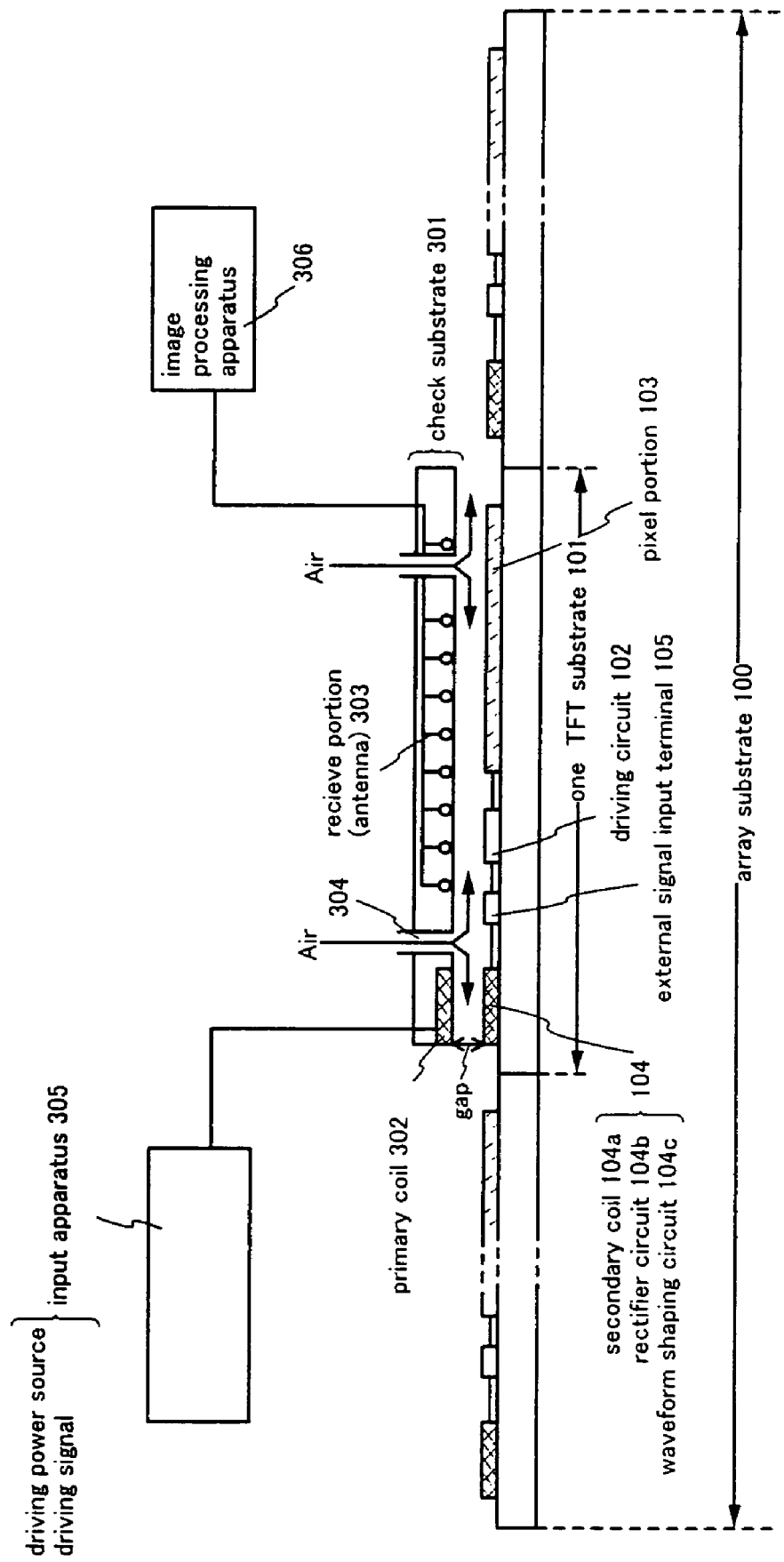

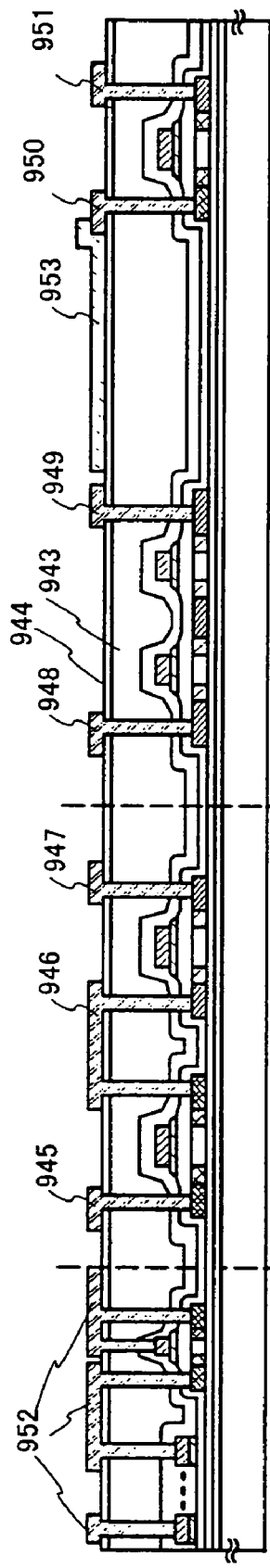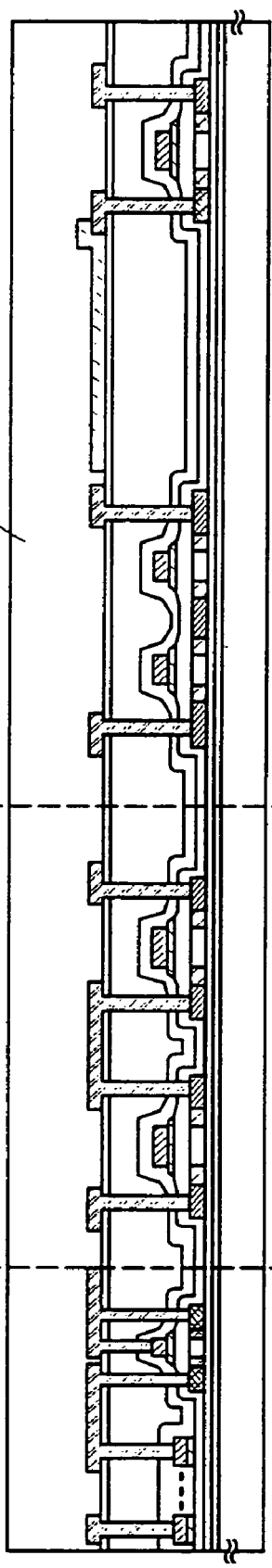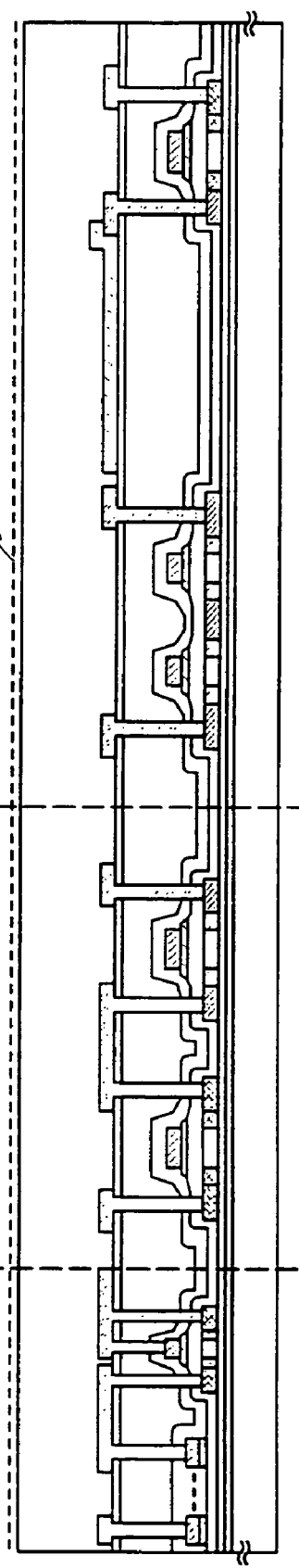

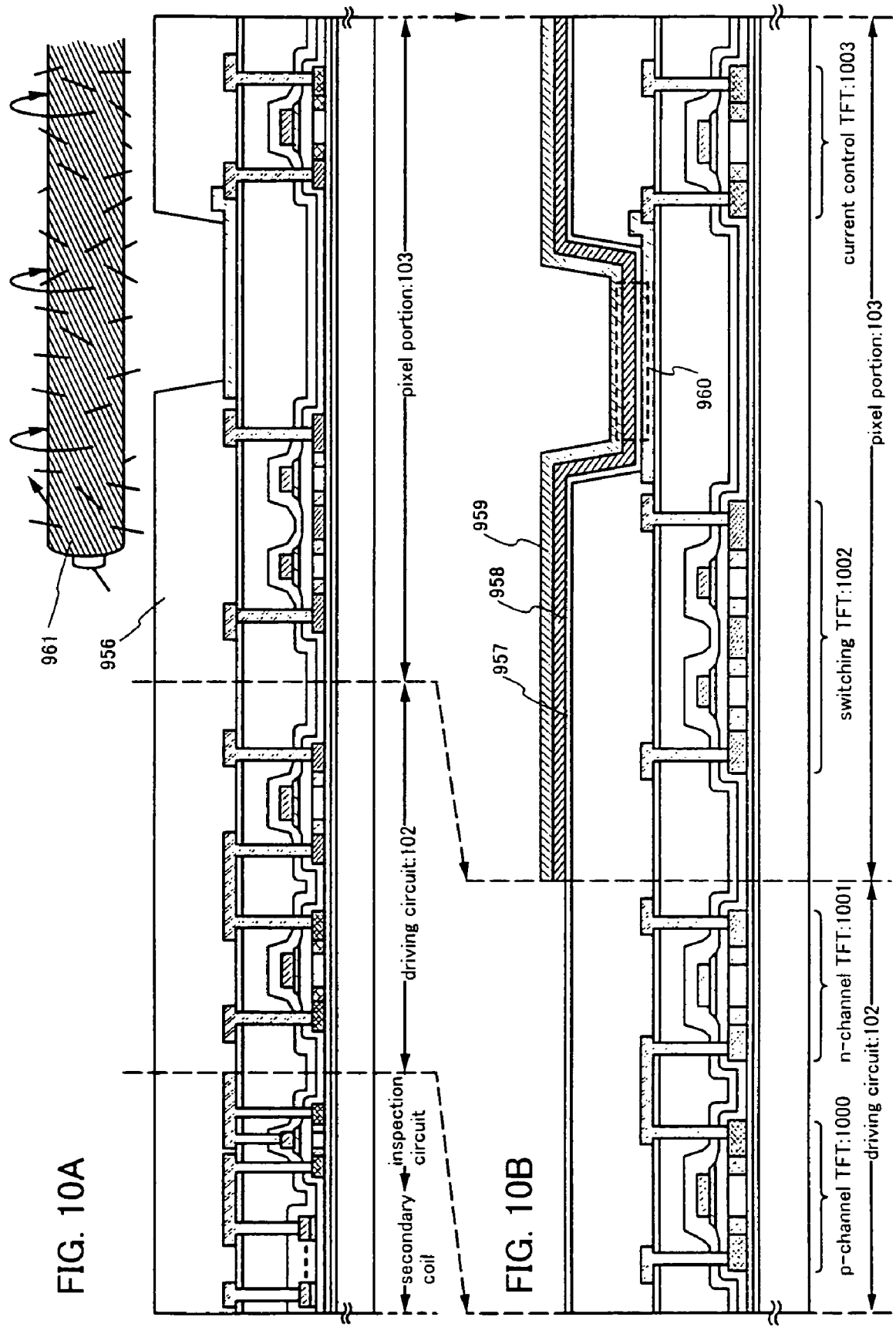

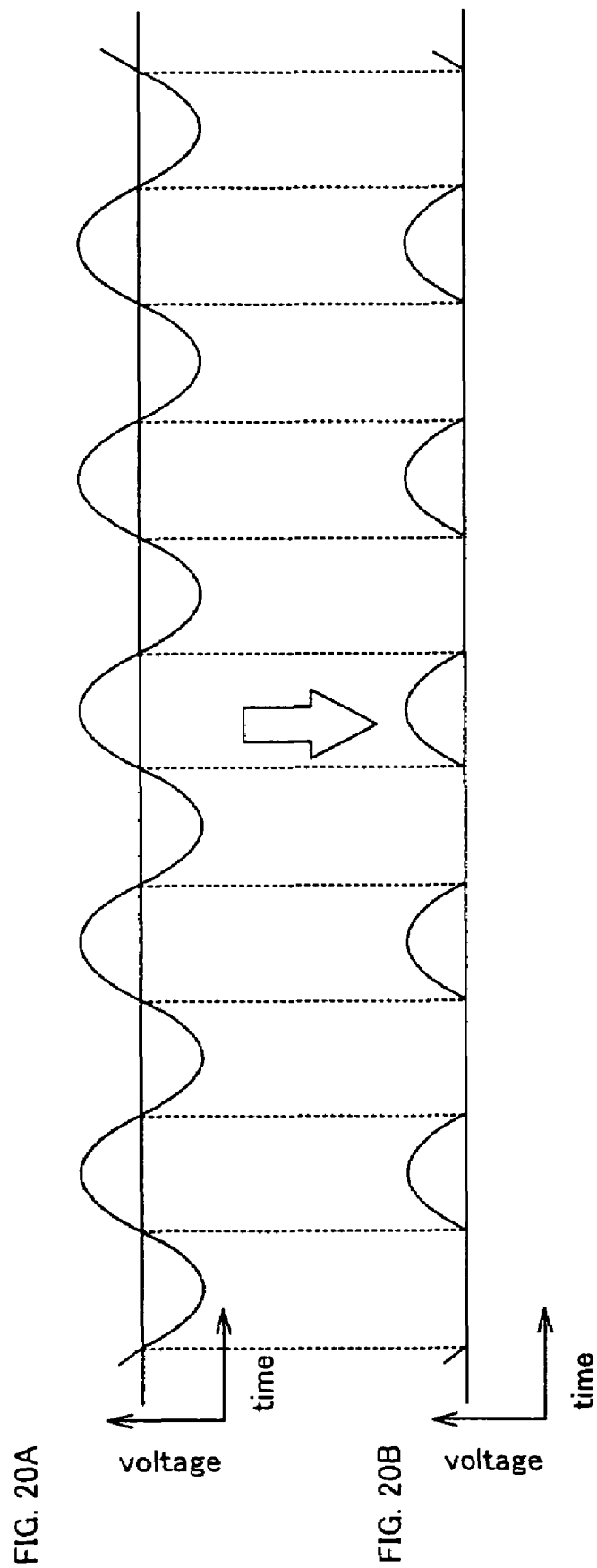

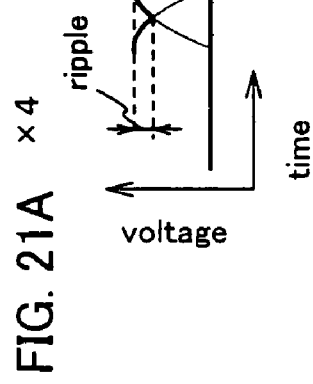
FIG. 21A ×4
ripple
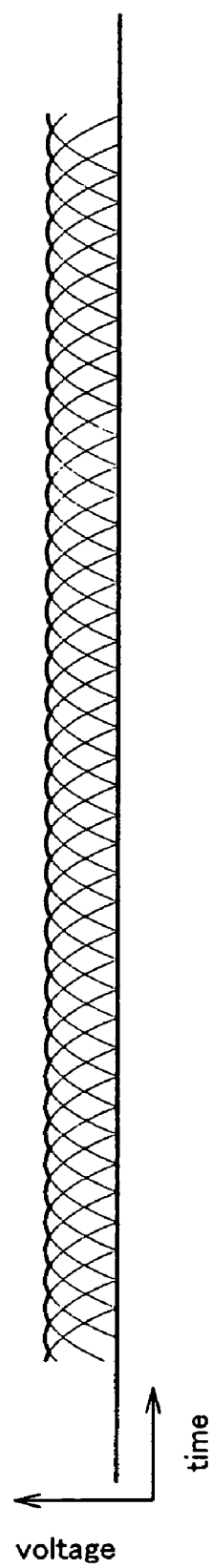
FIG. 21B ×8
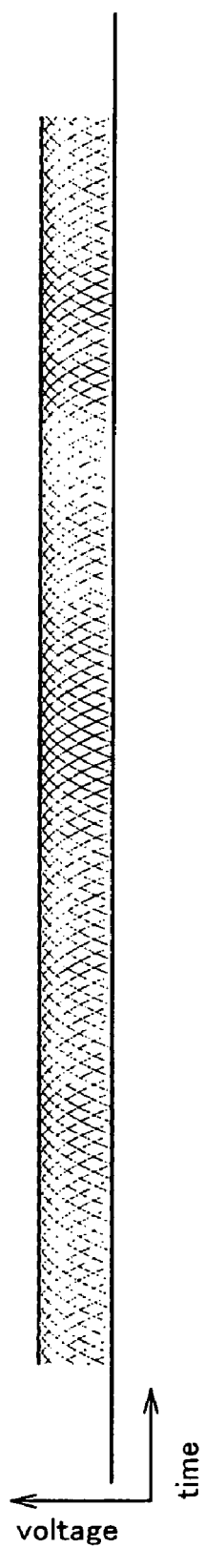
FIG. 21C ×16

METHOD OF MANUFACTURING A SEMICONDUCTOR DEVICE

This application is a divisional of U.S. application Ser. No. 10/102,277, filed on Mar. 18, 2002 now U.S. Pat. No. 7,105,365.

BACKGROUND OF THE INVENTION

1. Field of the Invention

The present invention relates to a method of manufacturing a semiconductor device including an inspection process of a semiconductor element that uses semiconductor characteristics (e.g., a transistor, in particular, a field-effect transistor; typically, a metal oxide semiconductor (MOS) transistor and a thin film transistor (TFT)). More specifically, the present invention relates to a non-contact type inspection apparatus and an inspection method using the same. The present invention also relates to a method of manufacturing a semiconductor device including an inspection process of such a semiconductor element.

2. Description of the Related Art

In an active matrix type liquid crystal display and an electroluminescence (EL) display, a TFT is generally provided in each pixel. In the case of a liquid crystal display, one TFT formed in each pixel functions as a switching element. In the case of an EL display, among a plurality of TFTs formed in each pixel, some TFTs function as switching elements, while others control a current.

It is very effective in terms of reduction in cost that an inspection process of identifying a defective product is included in an early stage in the course of manufacturing a display in which a number of TFTs are formed before a product is completed. The reasons for this are as follows: it is not required to conduct the succeeding steps with respect to a defective product; it is easy to repair a defective product due to early finding thereof, etc.

For example, in an EL display, one electrode (pixel electrode) of an EL element and a capacitor may be connected to each other with a transistor formed therebetween. It is difficult to confirm the presence of a defect until an EL display is completed and a display is actually conducted, even if there is some inconvenience in circuits or circuit elements for controlling light emission of a light-emitting element. Regarding even an EL panel that will not actually become a product, in order to be distinguished from a satisfactory product, a light-emitting element is formed, packaging is conducted, and a connector is attached to complete an EL display, whereby an inspection is conducted to the EL display. In this case, the processes of forming a light-emitting element, packaging, and attaching a connector become useless so that time and cost cannot be reduced. Furthermore, even in the case of forming an EL panel using a multiple-chamfered substrate, the processes of packaging and attaching a connector become useless, so that time and cost cannot be also reduced.

In order to detect a portion where a malfunction is caused due to the variation in pattern width of a semiconductor film, an insulating film, or a wiring (hereinafter, merely referred to as a "pattern") and a portion where wiring is disconnected or short-circuited due to dust or defective film formation, and to confirm if circuit or circuit elements to be inspected are operated normally, an inspection is conducted. Such a defect inspection is mainly classified into an optical inspection method and a probe inspection method.

According to the optical inspection method, a pattern formed on a substrate is read by a CCD or the like, and the read pattern is compared with a reference pattern to identify a defect. According to the probe inspection method, minute pins (probes) are put up at terminals on a substrate side, and a defect is identified based on the magnitude of a current or a voltage between the probes. In general, the former method is called a non-contact type inspection method, and the latter is called a stylus type inspection method.

A good TFT substrate that can be used for a product is discriminated from a defective TFT substrate that cannot be used for a product by the above-mentioned inspection method in which wiring is directly connected (contact) to a TFT substrate. However, according to this method, dust is likely to adhere to a substrate during attachment and removal of connection wiring. Furthermore, according to the method of detecting a defective portion by directly bringing minute pins (probes) into contact with wiring, wiring may be damaged. This inspection method may unnecessarily increase defective products during an inspection process. Also, according to the optical inspection method, a long time is required to inspect many times.

SUMMARY OF THE INVENTION

Therefore, with the foregoing in mind, it is an object of the present invention to provide a method of manufacturing a semiconductor device including a non-contact type inspection process that can confirm if circuits or circuit elements formed on a TFT substrate are operated normally before completion of an EL display, for the purpose of mass-production of active matrix type EL displays.

The inventors of the present invention found a method of allowing a current to flow through wiring of a TFT substrate by generating an electromotive force to the wiring by electromagnetic induction without directly connecting an inspection apparatus to an array substrate.

More specifically, in order to inspect a TFT substrate, a check substrate is separately prepared. The check substrate has primary coils, and an array substrate (TFT substrate) to be inspected has secondary coils.

The secondary coil is formed by patterning a conductive film formed on a substrate. According to the present invention, it is possible that the primary coils and secondary coils are those in which a magnetic substance is provided at the center to form a magnetic path. Also, coils in which a magnetic substance is not provided at the center can be used.

The primary coils of the check substrate are overlapped with the secondary coils of the array substrate so that a predetermined interval is kept therebetween and an a.c. voltage is applied between two terminals of the primary coils, whereby an electromotive force is generated between two terminals of the secondary coils. The interval between the check substrate and the array substrate is desirably as small as possible, and the primary coils and the secondary coils are preferably close to each other to such an extent that an interval therebetween can be controlled.

An a.c. voltage that is an electromotive force generated in the secondary coils is appropriately smoothened after being rectified in a TFT substrate, whereby the resultant voltage can be used as a d.c. voltage (hereinafter, referred to as a "power source voltage") for driving circuits or circuit elements of a TFT substrate. Furthermore, an a.c. voltage that is an electromotive force generated in the secondary coils is appropriately shaped by a waveform shaping circuit or the like, whereby the resultant voltage can be used as a signal (hereinafter, referred to as a "driving signal") for driving circuits or circuit elements of the TFT substrate.

The driving signal or the power source voltage is supplied to the TFT substrate, whereby the circuits or circuit elements are driven. When the circuits or circuit elements are driven, a weak electromagnetic wave or electric field is generated in the circuits or circuit elements. By confirming the state of a weak electromagnetic wave or electric field, a TFT substrate including circuits or circuit elements that are not normally operated can be found from a number of circuits or circuit elements.

As a method of confirming a weak electromagnetic wave or electric field generated in the circuits or circuit elements, a known method can be used.

According to the present invention, due to the above-mentioned configuration, the suitability of a TFT substrate for a product can be confirmed without directly connecting a probe to the TFT substrate. Therefore, a defect generated by minute dust that adheres to the TFT substrate during an inspection process is reduced, which can prevent a decrease in yield. Unlike an optical detection method, the suitability of a TFT substrate for a product can be determined in one inspection process. Therefore, the inspection process is more simplified, and can be conducted in a short period of time in the case of mass-production. Furthermore, unnecessary light-emitting elements are not formed.

BRIEF DESCRIPTION OF THE DRAWINGS

FIGS. 4A and 4B schematically show a check substrate and an array substrate;

FIG. 6 shows a relationship between a check substrate and an array substrate;

FIGS. 9A to 9C show an exemplary embodiment of the present invention;

FIGS. 10A and 10B show an exemplary embodiment of the present invention;

FIGS. 20A and 20B show a change in a signal that is rectified from an alternating current to a pulsating current with time;

FIGS. 21A to 21C show a change with time lapsed in a d.c. signal generated by addition of a pulsating current;

DESCRIPTION OF THE PREFERRED EMBODIMENTS

Embodiment Mode 1

Figure 1:
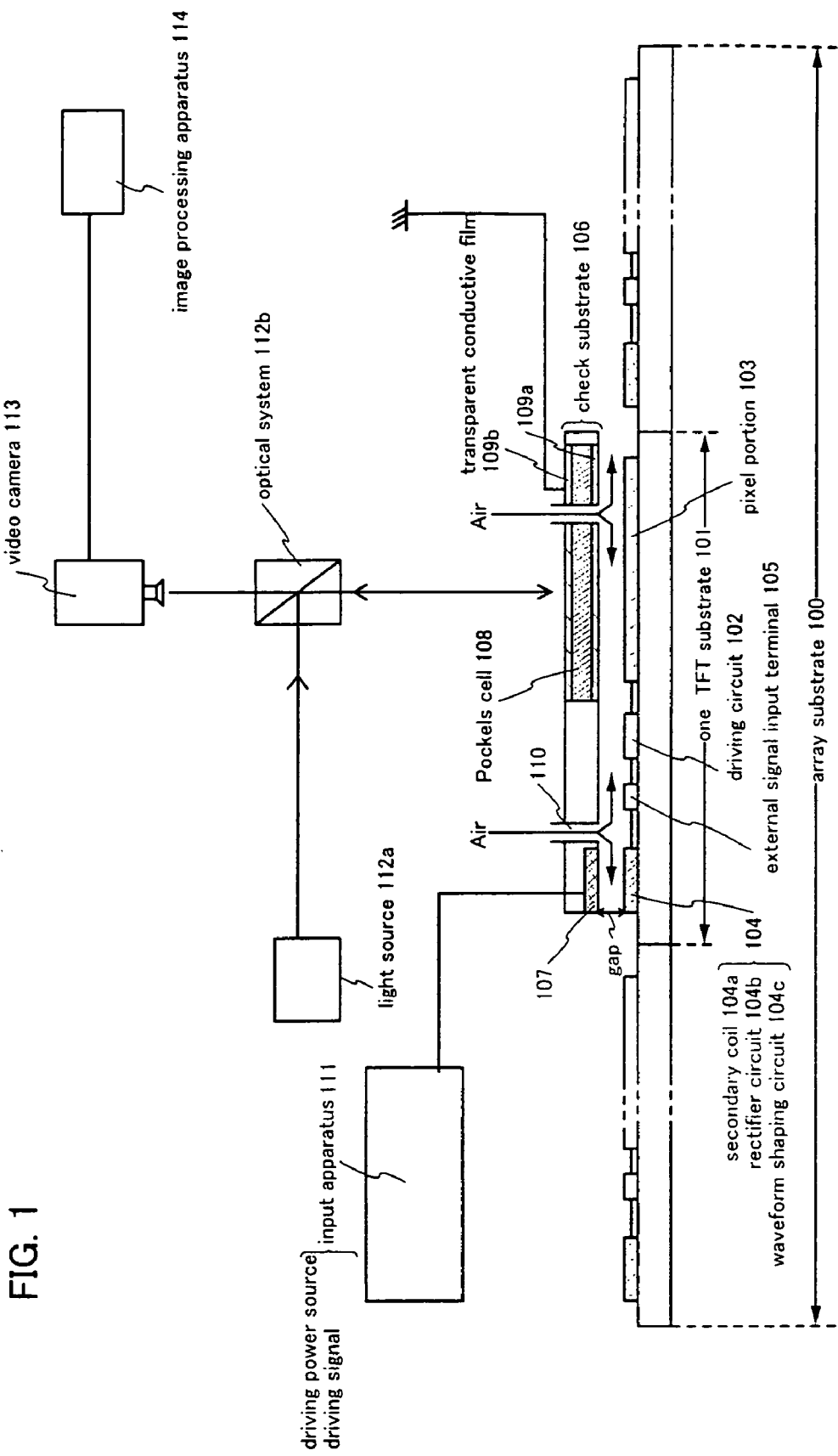
FIG. 1 shows a relationship between a check substrate and an array substrate.

In the present embodiment mode, a process of manufacturing a plurality of TFT substrates 101 on an array substrate 100, an inspection process of confirming the quality of manufactured TFT substrates, and a process of forming light-emitting elements on the TFT substrates that are determined to be satisfactory will be described with reference to FIGS. 1 to 5, and FIGS. 20A-B to 23A-23C.

In the present embodiment mode, the case of forming a light-emitting element on a TFT substrate will be described. However, the present invention is applicable not only to a light-emitting device (EL display) having a light-emitting element, but also to all the electric equipment using a semiconductor element which uses semiconductor characteristics, such as a liquid crystal display device, for example, a transistor, in particular, a field-effect transistor; typically, a MOS (Metal Oxide Semiconductor) transistor and a TFT (Thin Film Transistor).

First, driving circuits 102 including TFTs, pixel portions 103, transformer's secondary coils 104a, rectifier circuits 104b and waveform shaping circuits 104c, and external signal input terminals 105 are formed on the array substrate 100. A TFT shown in FIGS. 2A to 2D controls a current flowing through a light-emitting element in the pixel portion 103, and in the present specification, such a TFT will be referred to as a current control TFT. The transformer's secondary coil supplies a driving power source and a driving signal to a TFT substrate in a non-contact manner by using a transformer's primary coil provided on a check substrate. The rectifier circuit rectifies an a.c. voltage applied from a primary coil to a d.c. voltage. The waveform shaping circuit corrects an a.c. voltage applied from a primary coil to a waveform (or a shape close to a signal waveform) of a driving signal.

Figure 3:
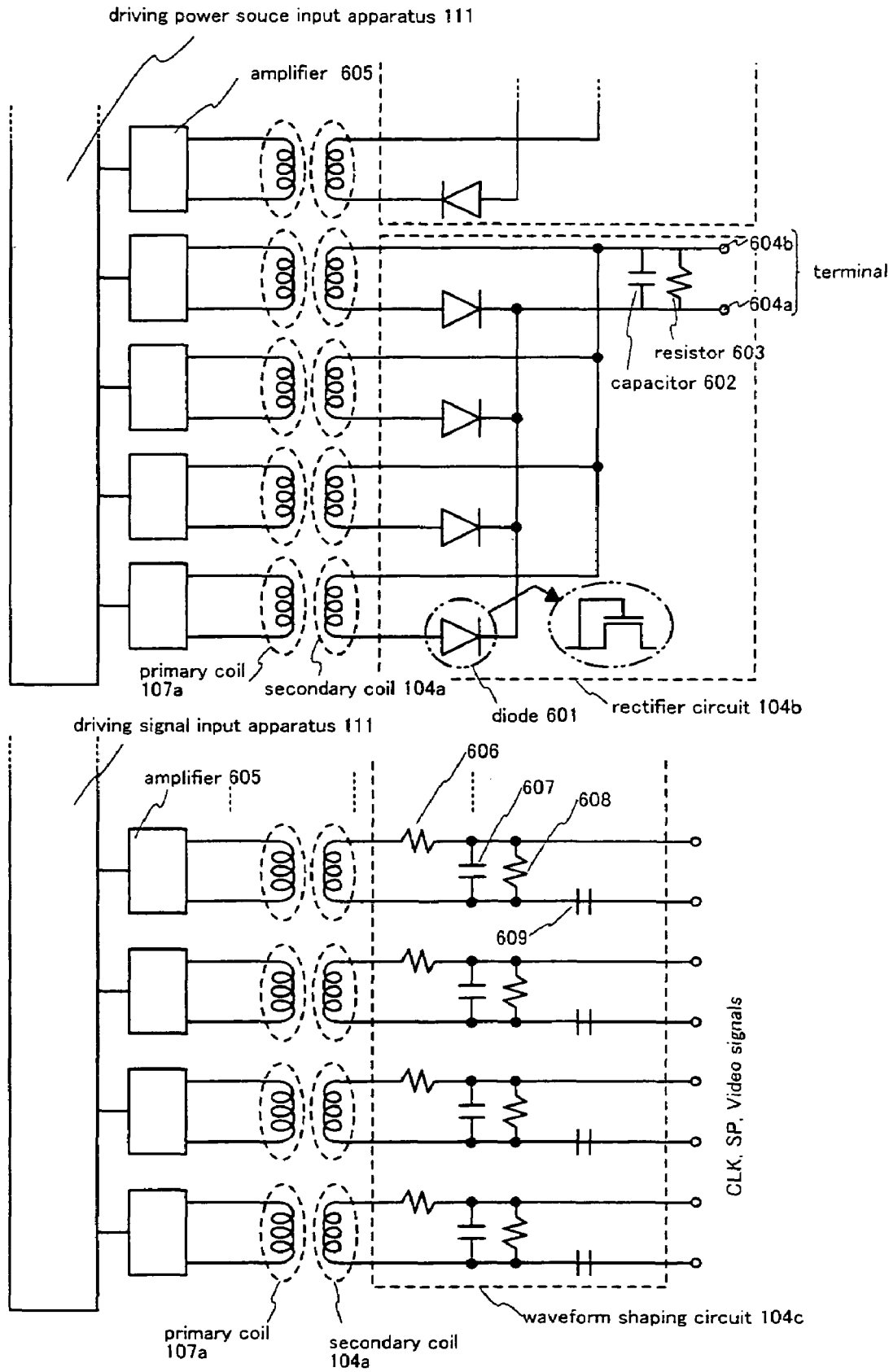
FIG. 3 shows circuit diagrams of a rectifier circuit and a waveform shaping circuit.

FIG. 3 shows schematic circuit diagrams of the rectifier circuit 104b and the waveform shaping circuit 104c. FIGS. 4A and 4B show schematic top views of the array substrate 100 and a check substrate 106.

Figure 2A:
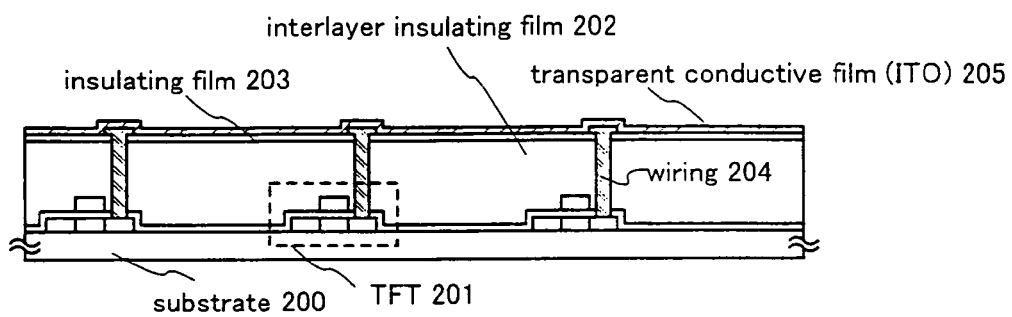
FIGS. 2A to 2D schematically illustrate processes of manufacturing a light-emitting device.
Figure 2B:
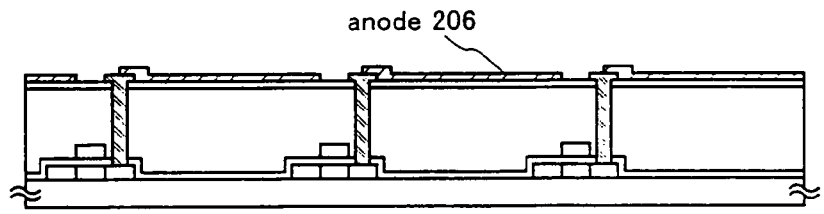
Figure 2C:
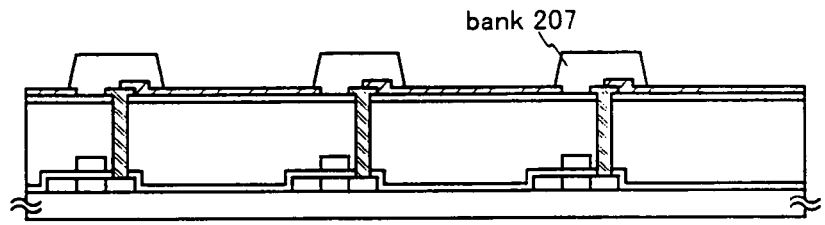

Then, an interlayer insulating film 202 is formed on TFTs 201 that formed on a substrate 200, followed by flattening. As the interlayer insulating film 202, an organic resin material selected from the group consisting of polyimide, acrylic resin, polyamide, polyimide-amide, epoxy resin, and benzocyclobutene (BCB), or an inorganic insulating material selected from the group consisting of silicon oxide and silicon oxynitride can be used. An average film thickness is set to be about 1.0 to 2.0 μm. (FIG. 2A)

Furthermore a insulating film 203 is formed on the interlayer insulating film 202, thereafter; a resist mask with a desired pattern is formed, and contact holes reaching drain regions of the TFTs 201 are formed to provide wirings 204. Wiring may be obtained by forming a conductive metal film made of Al, Ti, or an alloy thereof by sputtering or vacuum vapor deposition, followed by patterning into a desired shape.

Then, a transparent conductive film 205 to be an anode of a light-emitting element is formed. The transparent conductive film 205 is typically formed of indium tin oxide (ITO) or indium oxide mixed with 2 to 20% zinc oxide (ZnO).

The transparent conductive film 205 is etched to form pixel electrodes 206. An organic insulating film to be a bank 207 (in the present specification, an insulating film that has openings on the pixel electrodes and is provided so as to cover ends of the pixel electrodes will be referred to as a "bank") is formed, and an antistatic film may be formed on the surface of the organic insulating film for the purpose of preventing charging. The first reason for forming the antistatic film is to prevent dust from adhering to the array substrate during an inspection process conducted later.

The second reason for this is as follows. As an electrode material for a light-emitting element, an alkali metal material such as Al and Mg is used, which may give critical damage to the TFT characteristics. When alkali metal is mixed in an active layer of a TFT, electric characteristics of a TFT are changed, which makes it impossible to ensure reliability with time. In order to prevent the TFT characteristics from being impaired, a TFT manufacturing process treatment chamber (clean room) is separated from a light-emitting element manufacturing process treatment chamber (clean room), whereby an active layer of a TFT is prevented from being contaminated with alkali metal. Thus, while the treatment chambers are moved, dust is prevented from adhering to an array substrate.

Figure 5:
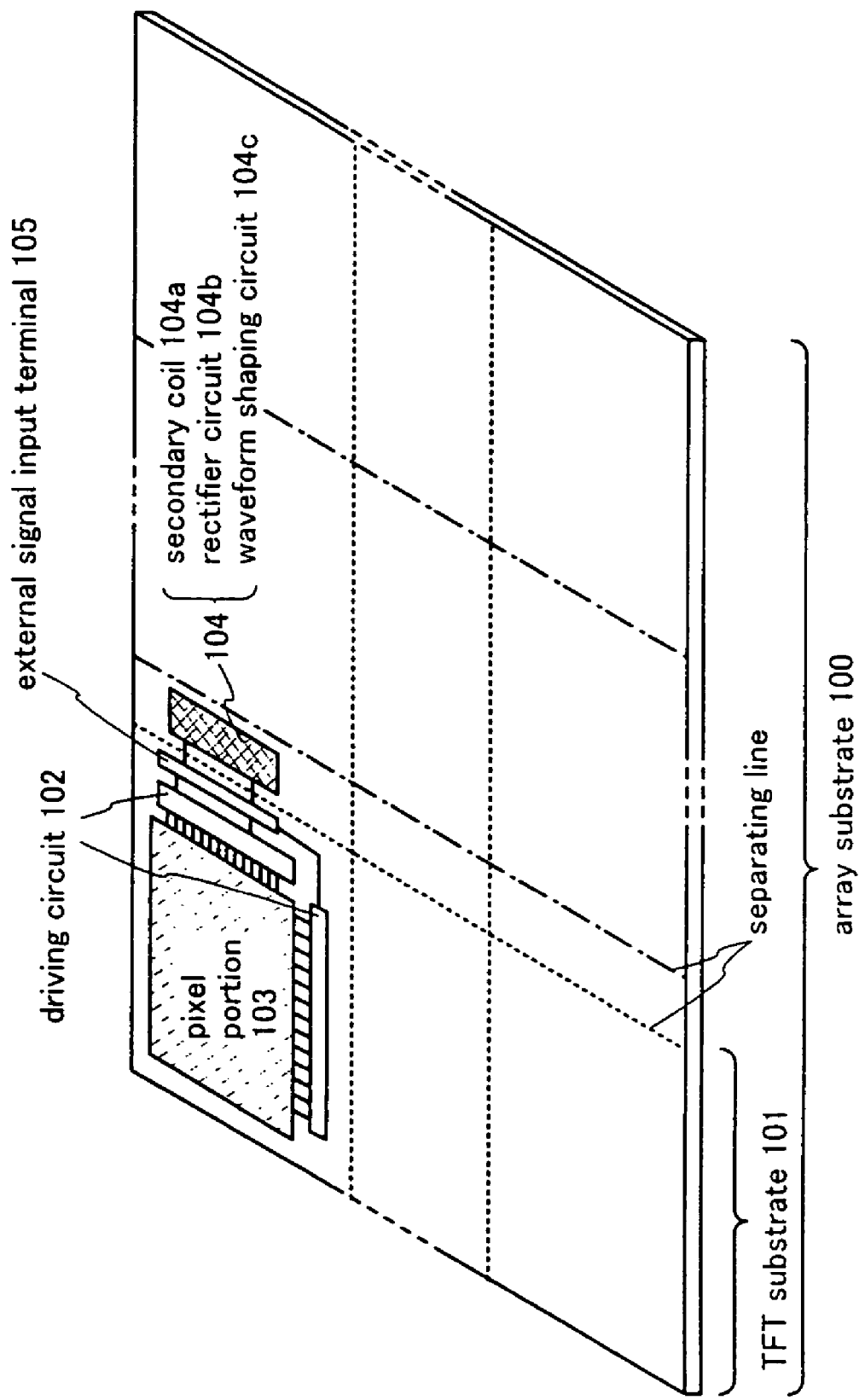
FIG. 5 shows a relationship between an array substrate and a TFT substrate.

For the above-mentioned reasons, the antistatic film is provided on the organic insulating film. In the present embodiment mode, the antistatic film may be formed of a known antistatic material that can be removed by washing with water. Any means for preventing charging may be used instead of forming an antistatic film. FIG. 5 shows a schematic view of the array substrate in this state.

Figure 22:
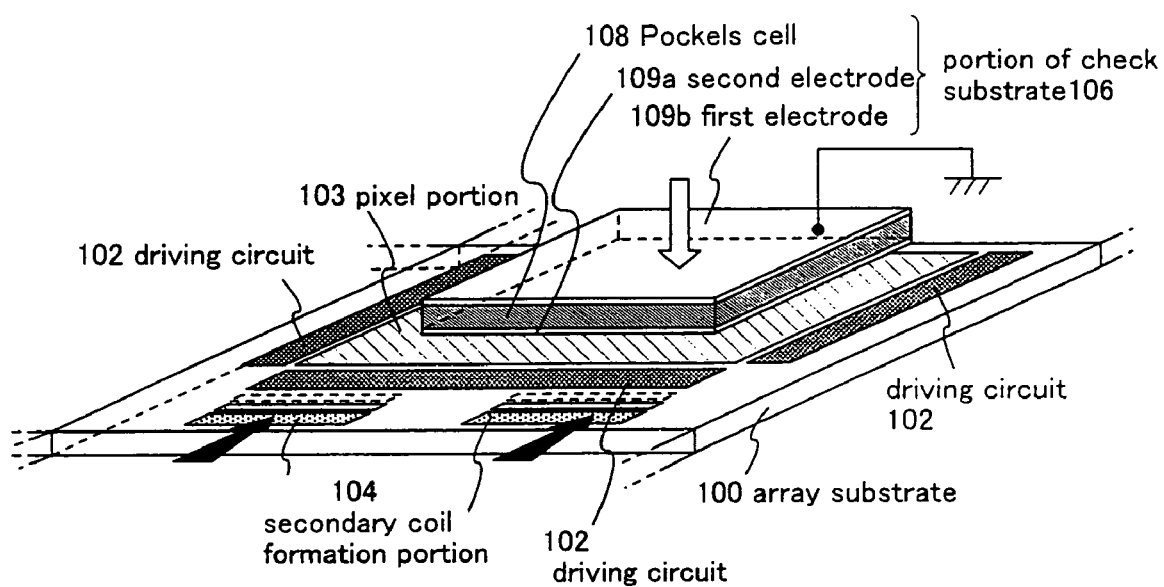
FIG. 22 is a perspective view showing an array substrate and a check substrate during inspection.

Then, an inspection for confirming the operation of circuits or circuit elements formed on the array substrate is conducted. The inspection process will be described with reference to FIG. 1 (FIG. 22).

On the array substrate 100, secondary coils 104a, rectifier circuits 104b, and waveform shaping circuits 104c are formed during the same process as that of manufacturing TFTs. A check substrate 106 is disposed above the array substrate 100.

The check substrate 106 is overlapped horizontally in the vicinity of the array substrate 100 in a non-contact manner (with a predetermined interval). The check substrate 106 supplies a power source voltage and a driving signal, and detects the operation of circuits or circuit elements on the array substrate (TFT substrate) based on a change in an electric field and an electromagnetic field.

As shown in FIG. 3, the rectifier circuit 104b is composed of a diode 601, a capacitor 602, and a resistor 603. The diode 601 rectifies an input a.c. voltage to a d.c. voltage. In the present embodiment mode, since the diodes of the rectifier circuit 104b are formed in the same process as that of forming TFTs on the array substrate, TFTs are substituted for diodes by a known method as shown in FIG. 3.

FIG. 20A shows a change with time in an a.c. voltage before being rectified in the diode 601. FIG. 20B shows a change with time in a voltage after being rectified. As is understood from comparison between the graph of FIG. 20A and the graph of FIG. 20B, the voltage after being rectified has 0 or a value having one polarity on a semi-period basis (so-called a pulsating voltage).

The pulsating voltage shown in FIG. 20B cannot be used as a power source voltage. Therefore, in general, charge is accumulated in a capacitor, whereby a pulsating voltage is smoothened to be a d.c. voltage. Actually, a pulsating voltage can be sufficiently smoothened by using a thin film semiconductor. However, because a large-capacity capacitor is necessary to form, the area of a capacitor itself becomes too large, which is not practical. Therefore, according to the present invention, pulsating voltages with different phases are combined with (added to) each other after being rectified, whereby the voltage is smoothened. According to the above-mentioned constitution, even if the capacity of the capacitor is small, a pulsating voltage can be sufficiently smoothened, and furthermore, even if a capacitor is not positively provided, a pulsating voltage can be sufficiently smoothened.

In FIG. 3, four pulsating signals with different phases output from four diodes 601, are added to each other to generate a power source voltage. However, the present invention is not limited thereto. The number of phase division is not limited to four. Any number of phase divisions may be used, as long as an output from a rectifier circuit can be smoothened so as to be used as a power source voltage.

FIGS. 21A to 21C show a change with time in a power source voltage obtained by adding a plurality of rectified signals to each other. FIG. 21A shows an example in which four pulsating voltages with different phases are added to each other to generate one power source voltage.

A power source voltage is generated by adding a plurality of pulsating currents, so that a ripple that is a component other than a d.c. current is present. A ripple refers to a difference between the highest voltage and the lowest voltage of a power source voltage. As a ripple is smaller, a power source voltage becomes closer to a d.c. current.

FIG. 21B shows a change with time in a power source voltage obtained by adding eight pulsating voltages with different phases. Compared with the change with time in the power source voltage shown in FIG. 21A, it is understood that a ripple is smaller.

FIG. 21C shows a change with time in a power source voltage obtained by adding 16 pulsating voltages with different phases. Compared with the change with time in the power source voltage shown in FIG. 21B, it is understood that a ripple is smaller.

As described above, it is understood that by adding a number of pulsating currents with different phases to each other, a ripple of a power source voltage becomes smaller, and a more satisfactory d.c. current can be obtained. Thus, as the number of phase division is larger, a power source voltage output from the rectifier circuit 104b is more likely to be smoothened. Furthermore, as the capacity of the capacitor 602 is larger, a power source voltage output from the rectifier circuit 104b is more likely to be smoothened.

A power source voltage generated in the rectifier circuit 104b is output through terminals 604a and 604b. More specifically, a voltage close to a ground is output from the terminal 604a, and a power source voltage having a positive polarity is output from the terminal 604b. By connecting the anode and the cathode of a diode in an opposite direction, the polarity of a power source voltage to be output can be made opposite. In the case where the anode and the cathode are connected to the terminals in an opposite direction with respect to the diode, the direction of an output becomes opposite.

Various circuits or circuit elements (a driving circuit, a peripheral logic circuit. etc.) are formed on the TFT substrate, and the magnitude of a power source voltage to be supplied to the circuits or circuit elements are varied depending upon the kind or use of each circuit or circuit element. In the rectifier circuit 104b shown in FIG. 3, by adjusting an amplitude of an input a.c. signal, the magnitude of a voltage to be input to each terminal can be adjusted. Furthermore, by changing terminals to be connected, depending upon the circuits or the circuit elements, a power source voltage supplied to the circuits or circuit elements can be varied.

The rectifier circuit 104*b* used in the present invention is not limited to the configuration shown in FIG. 3. The rectifier circuit 104*b* used in the present invention may be a circuit that can supply a d.c. power source voltage from an input a.c. current signal.

The waveform shaping circuit 104*c* is an electronic circuit used for forming an amount changing with time, i.e., a waveform of a voltage, a current, or the like, and shaping the waveform. In FIG. 3, each circuit element having resistors 606 and 608 and capacitors 607 and 609 are combined to constitute the waveform shaping circuit 104*c*. Needless to say, the waveform shaping circuit 104*c* is not limited to the configuration shown in FIG. 3. The waveform shaping circuit 104*c* used in the present invention generates a clock signal (CLK), a start pulse signal (SP), and a video signal from an electromotive force of an input a.c. current and output them. The signals output from the waveform shaping circuit 104*c* are not limited to those described above. Signals with any waveform can be output from the waveform shaping circuit 104*c*, as long as they are capable of generating an electromagnetic wave or an electric field capable of specifying a defective portion by monitoring in circuits or circuit elements of the TFT substrate. Also, an amplifier is indicated by reference numeral 605.

On the check substrate 106, a transformer's primary coil 107, a material (Pockels cell or liquid crystal) 108 whose optical characteristics are varied due to the change in an electric field, and transparent conductive films (typically made of ITO) 109*a* and 109*b* formed so as to sandwich the material 108 are provided, and the transparent conductive film 109*b* is grounded.

The primary coil 107*a* formed on the check substrate 106 and the secondary coil 104*a* formed on the array substrate are not those in which a magnetic substance is provided at the center to form a magnetic path. When the check substrate 106 and the array substrate 100 are kept so that they are close to each other, the secondary coil 104*a* generates an electromotive force between two terminals thereof by applying an a.c. voltage between two terminals of the primary coil 107*a*.

An a.c. voltage that is an electromotive force generated in the secondary coil 104*a* is rectified and smoothened by the rectifier circuit 104*b* formed on the array substrate 100, whereby the voltage thus smoothened can be used as a d.c. voltage (hereinafter, referred to as a "power source voltage") for driving the circuits or circuit elements on the array substrate 100. Furthermore, an a.c. voltage that is an electromotive force generated in the secondary coil 104*a* is appropriately shaped to a signal waveform by the waveform shaping circuit 104*c* formed on the array substrate 100, whereby the voltage thus shaped can be used as a signal (hereinafter, referred to as a "driving signal") for driving the circuits or circuit elements on the array substrate 100.

Figure 23A:
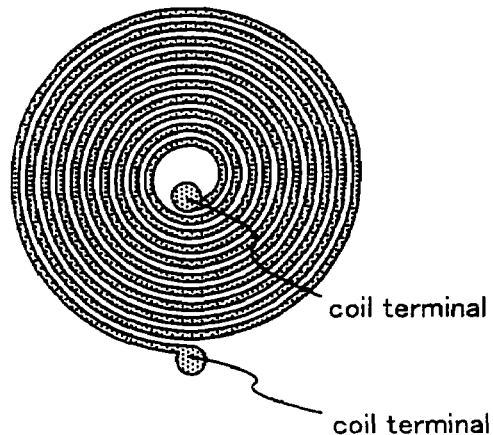
FIGS. 23A to 23C show enlarged coils.
Figure 23B:
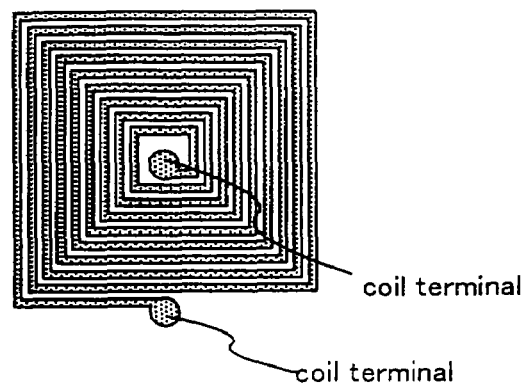
Figure 23C:
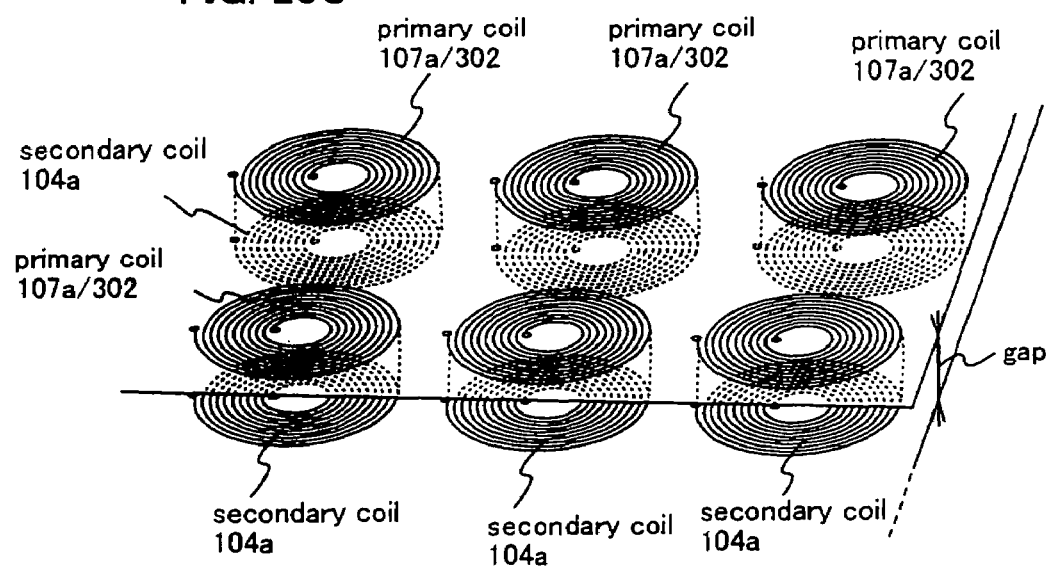

Next, the configurations of the primary coil 107*a* and the secondary coil 104*a* will be described in detail. FIGS. 23A to 23C show an enlarged view of the coils.

The coil shown in FIG. 23A has a circular spiral shape, in which coil terminals are formed at both ends of the coil. The coil shown in FIG. 23B has a rectangular spiral shape, in which coil terminals are formed at both ends of the coil.

Regarding the coil used in the present invention, it is only required that the entire wiring of the coil is formed on the same plane, and the wiring of the coil is wound in a spiral shape. Therefore, when seen in a vertical direction to the plane on which a coil is formed, the wiring of the coil may exhibit a circular shape or an angular shape.

Furthermore, the number of turns of a coil, a line width, and an area occupying a substrate can be appropriately set by a designer, if desired.

As shown in FIG. 1, a primary coil formation portion 107 of the check substrate 106 and a secondary coil formation portion 104 of the array substrate (TFT substrate) 100 are overlapped with each other with a predetermined interval therebetween.

FIG. 23C shows an enlarged view of a portion where the primary coil formation portion 107 is overlapped with the secondary coil formation portion 104. In FIG. 23C, the winding direction of the wiring of the primary coil 107*a* is the same as that of the secondary coil 104*a*. However, the present invention is not limited to this configuration. The winding direction of the primary coil may be opposite to that of the secondary coil.

In the present embodiment mode, a gas is injected between the check substrate 106 and the array substrate 100 through the check substrate 106 under a predetermined pressure, whereby a predetermined interval is kept therebetween. This interval may be appropriately determined by those skilled in the art. However, in the present embodiment mode, an interval is preferably in a range of 10 to 200 μm. Furthermore, in order to inject a gas between the check substrate 106 and the array substrate 100, the check substrate 106 is provided with a plurality of holes 110 for injecting a gas.

Insulating liquid may be used in place of a gas, so as to keep a predetermined interval between the array substrate 100 and the check substrate 106.

An inspection apparatus is provided with a driving power source and a driving signal input apparatus 111, a light source (a light source having no interference such as a halogen lamp and a discharge lamp may be used) 112*a*, an optical system 112*b*, a video camera 113, and an image processing apparatus 114. Before a voltage is applied to a TFT, light from the light source 112*a* is radiated and a light state from the surface of Pockels cell is captured as an image by the video camera 113, followed by conducting image processing by using the image processing apparatus 114.

As means for detecting information on an operation of circuits or circuit elements formed on the array substrate (TFT substrate) 100, provided on the check substrate 106, a material (Pockels crystal) such as liquid crystal or Pockels cell whose optical characteristics are changed due to a change in an electric field can be used. In the check substrate 106, Pockels cell 108 is sandwiched between the first electrode 109*a* and the second electrode 109*b* (FIG. 22).

Pockels cell is an optical element having an electrooptic effect (Pockels effect), which utilizes the property that electrooptic characteristics are changed upon the application of a voltage. This property can be used for light modulation, shutter, and generation and detection of circularly polarized light, by applying an a.c. voltage or a pulse voltage to crystal. More specifically, Pockels cell is crystal of $NH_4H_2PO_4$, $BaTiO_3$, $KH_2PO$ (KHP), $KD_2PO_4$ (D KDP), $LiNbO_3$, ZnTe, or ZnO.

The circuits or circuit elements on the array substrate are driven to change an electric field, and the change in an electric field causes birefringence in Pocket cell, whereby a transmittance looks different. More specifically, compared with Pockels cell in a portion overlapped with a normal circuit or circuit element, Pockels cell in a portion overlapped with a defective circuit or circuit element looks brighter or darker.

For example, a light transmittance is varied between a normal TFT and a defective TFT formed in a pixel. The reason for this is as follows: when a device substrate is disposed so as to be vertical to an optical axis of ferroelectric crystal of Pockels cell, birefringence is caused in the ferroelectric crystal due to an electric field generated in a circuit or a circuit element.

The refractive index of birefringence with respect to polarized light having a component in a direction of an electric field is determined by the intensity of an electric field. Therefore, in a plurality of circuits or circuit elements that have the same structure and are operated normally, an electric field with the same intensity is generated, so that the refractive index of ferroelectric crystal in a portion overlapped with each circuit or circuit element becomes substantially the same.

However, an electric field generated in a defective circuit or circuit element is stronger or weaker than that generated in the other normal circuits or circuit elements. Therefore, the refractive index of ferroelectric crystal in a portion overlapped with a defective circuit or circuit element is different from that in portions overlapped with the other normal circuits or circuit elements. When a device substrate is seen through Pockels cell, a portion overlapped with a defective circuit or circuit element looks brighter or darker, compared with portions overlapped with normal circuits or circuit elements.

For example, as shown in FIG. 1, the following is possible: light in a direction vertical to the array substrate is split by using an optical system such as a polarized beam splitter, and the intensity of the light is monitored, whereby a transmittance of Pockels cell is calculated to detect a defective portion. Results obtained by monitoring light a plurality of times may be subjected to some arithmetic processing to detect a defective portion.

It may also be possible that outputs from all the circuits to be inspected are input to a circuit dedicated for inspection, and the intensity of an electric field generated in the circuit dedicated for inspection is measured by using an electrooptic element, whereby the presence of a defect is specified or a defective portion itself is specified. The use of the circuit dedicated for inspection makes it unnecessary to monitor light using Pockels cell in all the circuits or circuit elements to be inspected, thereby simplifying and speeding up an inspection process.

The detection of a defect is not limited to a pixel portion and the present detection method is applicable to any circuit and circuit element. For example, it is possible that Pockets cell is overlapped with a driving circuit or a signal line driving circuit, and a refractive index is monitored, whereby a defective portion can be similarly detected. Furthermore, defects such as disconnection and a short-circuit caused in routed wiring on a device substrate can be similarly detected.

Because of the above-mentioned inspection process, it is confirmed if each TFT substrate on the array substrate is suitable for a product. Thereafter, in the case where an antistatic film has been formed before the inspection process, the antistatic film is removed, and the organic insulating film is etched to form the bank 207, followed by a heat treatment at 230° C. to 350° C.

Then, the array substrate 100 is separated to form the TFT substrates 101. It may be appropriately determined by those skilled in the art how to form TFT substrates and the secondary coil formation portion 104 (the secondary coil 104a, the rectifier circuit 104b, and the waveform shaping circuit 104c) on the array substrate 100. However, preferably, TFT substrates 101 and the detection circuit are formed so that the driving circuit on the TFT substrate 101 can be separated from the secondary coil 104a, the rectifier circuit 104b, and the waveform shaping circuit 104c used in the inspection process so as not to leave electrical and physical connection therebetween, as shown in FIG. 5.

Then, on the pixel electrode 206 of the TFT substrate 101 determined to be suitable for a product in the above-mentioned inspection process, an insulating film 208, an organic compound layer 209, and a cathode 210 are formed. A TFT substrate determined to be unsuitable for a product is removed from the manufacturing process for analysis of a defect. When it is possible to repair the defective TFT substrate so as to be suitable for a product the defective TFT is repaired and returned to the inspection process again.

As the insulating film 208, an organic resin insulating film made of polyimide, polyamide, acrylic resin, or the like is formed to have a thickness of 1 to 5 nm by spin coating.

Figure 2D:
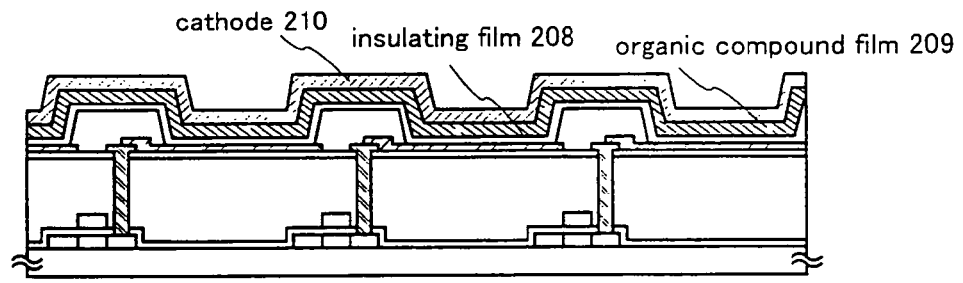

The organic compound layer 209 is formed by stacking a combination of a plurality of layers including a hole injection layer, a hole transport layer, a hole blocking layer, an electron transport layer, and an electron injection layer, as well as a light-emitting layer. The thickness of the organic compound layer 209 is preferably about 10 to 400 nm. (FIG. 2D)

The cathode 210 is formed by vapor deposition after forming the organic compound layer 209. As a material for the cathode 210, not only MgAg or an Al—Li alloy (alloy of aluminum and lithium), but also a film formed by covapor deposition of an element belonging to Group 1 or 2 in the periodic table and aluminum may be used. The thickness of the cathode 210 is preferably about 80 to 200 nm.

As described above, a light-emitting device can be manufactured by using a plurality of TFT substrates 101 formed on the array substrate 100.

In the present embodiment mode, a glass substrate is used as an array substrate. However, a quartz substrate or a plastic substrate may be used. In the case of using a plastic substrate, a heat-resistant temperature of the substrate is low, so that those skilled in the art may appropriately determine a manufacturing process conducted at a temperature which the plastic substrate can withstand.

The number of turns, line width, shape, and area occupying a substrate of a coil formed on the check substrate and the array substrate can be appropriately determined by those skilled in the art. However, it is important to determine them, considering that the ratio of the number of turns of a secondary coil to that of a primary coil is inversely proportional to the ratio of a voltage introduced to the secondary coil to that applied to the primary coil.

Embodiment Mode 2

In the present embodiment mode, another inspection method for a TFT substrate will be described with reference to FIGS. 4A and 4B and 6.

When circuits or circuit elements on a TFT substrate formed on an array substrate are operated, an electromagnetic wave is generated. According to the inspection method disclosed in the present embodiment mode, by measuring the intensity and frequency of the electromagnetic wave, and the intensity and frequency of the electromagnetic wave on the basis of a certain period of time, it is confirmed if a TFT substrate is suitable for a product.

The intensity and frequency of an electromagnetic wave of a circuit on a TFT substrate determined to be satisfactory (suitable for a product), and the intensity and frequency thereof on the basis of a certain period of time may be previously measured and used for comparison for determining the suitability of a TFT substrate for a product.

Then, circuits or circuit elements on a TFT substrate formed on an array substrate are supplied with a power source voltage and a driving signal by utilizing electromagnetic induction. At this time, the intensity and frequency of an electromagnetic wave and the intensity and frequency thereof on the basis of a certain period of time (a certain timing) are measured by using a check substrate having antennas capable of measuring an electromagnetic wave.

The check substrate 301 is provided with a primary coil 302 in the same way as in Embodiment mode 1. When an a.c. voltage is applied between two terminals of the primary coil from a driving power source and a driving signal input apparatus 305, an electromotive force is generated between two terminals of the secondary coil 104a.

Then, an a.c. voltage that is an electromotive force generated in the secondary coil 104a is rectified and smoothed by the rectifier circuit 104b formed on the array substrate 100, whereby the smoothened voltage can be used as a d.c. voltage (hereinafter, referred to as a "power source voltage") for driving circuits or circuit elements of the array substrate. Furthermore, an a.c. voltage that is an electromotive force generated in the secondary coil 104a is appropriately shaped to a signal waveform by a waveform shaping circuit 104c formed on the array substrate 100, whereby the shaped voltage can be used as a signal (hereinafter referred to as a "driving signal") for driving the circuits or circuit elements on the array substrate 100.

When a driving power source and a driving signal are supplied by the rectifier circuit and the waveform shaping circuit, as described in Embodiment mode 1, the circuits or circuit elements formed on the TFT substrate are operated to generate an electromagnetic wave. The intensity and spectrum of the generated electromagnetic wave and the intensity and spectrum thereof on a timing basis are measured by antennas 303 provided on the check substrate 301. As the antennas 303 (electromagnetic sensors) provided on the check substrate 301, known sensors (antennas) having a measurement frequency band of 1 MHz to 1 GHz may be used. Furthermore, in order for the check substrate 301 not to come into contact with the array substrate 100, and to enhance measurement repeatability of an electromagnetic wave generated from the circuits or circuit elements on the array substrate 100, it is required to always keep a predetermined interval between the check substrate 301 and the array substrate 100. In the present embodiment mode, gas is injected into the check substrate 301 under a predetermined pressure, whereby a predetermined interval is kept between the check substrate 301 and the array substrate 100. This interval may be appropriately determined by those skilled in the art. However, in the present embodiment mode, the interval is set so as to fall within a range of 10 to 200 μm. In order to inject gas, the check substrate is provided with a plurality of holes 304. FIGS. 4A and 4B schematically show relationships between the primary coils 302 and a external signal input terminal on the check substrate 301 and between the secondary coils 104a and an external signal input terminal 105 on the array substrate 100.

In the antennas 303, in order to obtain a resolution required for obtaining positional information such as the intensity and frequency of an electromagnetic wave generated from minute circuits or circuit elements formed on the array substrate 100, it is preferable that an interval for forming antennas 303 on the check substrate 301 is made as small as possible so that more small antennas can be formed. The interval for forming antennas 303 may be appropriately determined by those skilled in the art so that an optimum resolution is obtained in accordance with a pixel size.

Furthermore, by keeping an interval between the check substrate and the array substrate to be a predetermined value as small as possible (100 μm or less in the present embodiment mode), a resolution can be enhanced.

Measurement result of the intensity and frequency of an electromagnetic wave is obtained by the antennas 303 and is analyzed by an image processing apparatus 306. Thereby, intensity distribution of the electromagnetic wave can be displayed, for example, by a color-code.

According to the inspection method disclosed in the present embodiment mode, the operation of the circuits or circuit elements formed on the array substrate is confirmed by measuring the intensity and frequency of an electromagnetic wave generated from the circuits or circuit elements and the intensity and frequency of an electromagnetic wave on the basis of a certain period of time at the same time. Therefore, it can be confirmed if a TFT substrate is suitable for a product within a short period of time.

When the inspection process described in the present embodiment mode is completed, the array substrate 100 is separated into individual TFT substrates 101. Thereafter, a light-emitting element may be formed on a TFT substrate determined to be suitable for a product to produce an EL display. A TFT substrate may be attached to a counter substrate, liquid crystal being sealed therebetween to produce a liquid crystal display.

Because of the above-mentioned inspection process included in the manufacturing process, a light-emitting element is not formed on a TFT substrate that includes a number of defective pixels or defective driving circuits. Therefore, a material for forming a light-emitting element is not wasted, which can reduce production cost.

Furthermore, a driving power source or a driving signal can be sent to an array substrate in a non-contact manner. Therefore, dust is prevented from adhering to the array substrate during the inspection process (or preparation for the inspection process) to contaminate the array substrate.

Embodiments

Embodiment 1

In the present embodiment, a light-emitting element manufactured according to the present invention will be described. Herein, an example of a method of manufacturing a pixel portion having a light-emitting element of the present invention, TFTs (an n-channel TFT and a p-channel TFT) of a driving circuit provided on the periphery of the pixel portion, a secondary coil of a transformer, a rectifier circuit and a waveform shaping circuit for inspecting driving of a TFT substrate on the same substrate will be described with reference to FIGS. 7A-7D to 10A and 10B.

First, in the present embodiment, a substrate 900 made of glass such as barium borosilicate glass or aluminoborosilicate glass, which is represented by #7059 glass and #1737 glass produced by Corning Co., is used. As the substrate 900, any substrate having transparency can be used, and a quartz substrate may be used. Furthermore, a plastic substrate having heat resistance withstanding a treatment temperature of the present embodiment may be used.

Figure 7A:
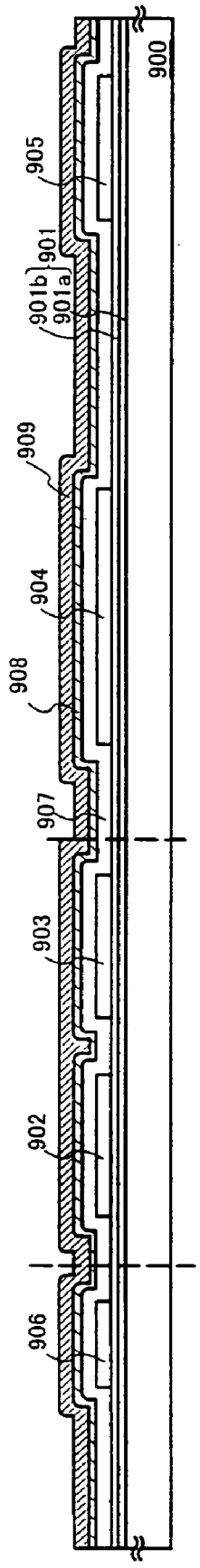
FIGS. 7A to 7D show an exemplary embodiment of the present invention.

Then, as shown in FIG. 7A, a base insulating film 901 made of an insulating film such as a silicon oxide film, a silicon nitride film, or a silicon oxynitride film is formed on the substrate 900. In the present embodiment, the base insulating film 901 has a double-layered structure. However, the base insulating film 901 may have a single-layered structure or a multi-layered structure of two or more layers of the insulating film. As a lower layer of the base insulating film 901, a silicon oxynitride film 901a is formed to a thickness of 10 to 200 nm (preferably, 50 to 100 nm), using $SiH_4$, $NH_3$, and $N_2O$ as a reaction gas by plasma CVD. In the present embodiment, the silicon oxynitride film 901a (composition ratio: Si=32%, O=27%, N=24%, and H=17%) was formed to a thickness of 50 nm. Then, as an upper layer of the base insulating film 901, a silicon oxynitride film 901b is formed thereon to a thickness of 50 to 200 mn (preferably, 100 to 150 nm), using $SiH_4$ and $N_2O$ as a reaction gas by plasma CVD. In the present embodiment, the silicon oxynitride film 901b (composition ratio: Si=32%, O=59%, N=7%, and H=2%) was formed to a thickness of 100 nm.

Then, semiconductor layers 902 to 906 are formed on the base insulating film 901. The semiconductor layer 906 is for forming a diode by deforming a TFT in a rectifier circuit. In the present specification, a semiconductor layer including a channel forming region and regions to be a source region and a drain region later where an n-type impurity is added in a high concentration will also be referred to as an active layer. The semiconductor layers 902 to 906 are obtained by forming a semiconductor film having an amorphous structure by a known method (sputtering, LPCVD, plasma CVD, or the like), subjecting the semiconductor film to known crystallization (laser crystallization, thermal crystallization, thermal crystallization using a catalyst such as nickel) to obtain a crystalline semiconductor film, and pattering the crystalline semiconductor film into a desired shape. The semiconductor layers 902 to 906 are formed to a thickness of 25 to 80 nm (preferably, 30 to 60 nm). There is no particular limit to a material for the crystalline semiconductor film. Preferably, the crystalline semiconductor film may be made of silicon or a silicon germanium ($Si_xGe_{1-x}$(X=0.0001 to 0.02)) alloy. In the present embodiment, an amorphous silicon film was formed to a thickness of 55 nm by plasma CVD, and thereafter, a solution containing nickel was held on the amorphous silicon film. The amorphous silicon film was dehydrated at 500° C. for one hour, thermally crystallized at 550° C. for 4 hours, and subjected to laser annealing for improving crystallization, whereby a crystalline silicon film is formed. The crystalline silicon film was patterned by photolithography to form the semiconductor layers 902 to 906.

After the semiconductor layers 902 to 906 are formed, in order to control a threshold value of a TFT, the semiconductor layers 902 to 906 may be doped with a trace amount of impurity element (boron or phosphorus).

In the case of manufacturing a crystalline semiconductor film by laser crystallization, a pulse-oscillation type or continuous light-emitting type excimer laser, YAG laser, or $YVO_4$ laser can be used. In the case of using these lasers, a method may be adopted so that laser light emitted from a laser oscillator is condensed in a line shape by an optical system and radiated to the semiconductor film. The conditions for crystallization are appropriately selected by those skilled in the art. However, in the case of using an excimer laser, a pulse oscillation frequency is set to 300 Hz, and a laser energy density is set to 100 to 400 mJ/cm$^2$ (typically, 200 to 300 mJ/cm$^2$). In the case of using a YAG laser, second harmonics are used, a pulse oscillation frequency is set to 30 to 300 kHz, and a laser energy density is set to 300 to 600 mJ/cm$^2$ (typically, 350 to 500 Mj/cm$^2$). Laser light condensed in a line shape with a width of 100 to 1000 μm (e.g., 400 μm) is radiated over the entire surface of the substrate and an overlap ratio of the line-shaped laser light at this time may be 50 to 90%.

Then, a gate insulating film 907 is formed so as to cover the semiconductor layers 902 to 906. The gate insulating film 907 is made of an insulating film containing silicon with a thickness of 40 to 150 nm by plasma CVD or sputtering. In the present embodiment, a silicon oxynitride film (composition ratio: Si=32%, O=59%, N=7%, and H=2%) is formed to a thickness of 110 nm by plasma CVD as the gate insulating film 907. Needless to say, the gate insulating film 907 is not limited to a silicon oxynitride film, and may have a single-layered structure or a multi-layered structure of another insulating film containing silicon.

In the case of using a silicon oxide film, the gate insulating film 907 can be formed by plasma CVD, mixing tetraethyl orthosilicate (TEOS) with $O_2$, and conducting discharge under a reaction pressure of 40 Pa, a substrate temperature of 300° C. to 400° C., and a high-frequency (13.56 MHz) power density of 0.5 to 0.8 W/cm$^2$. The silicon oxide film thus produced can exhibit satisfactory characteristics as the gate insulating film by a subsequent step of thermal annealing at 400° C. to 500° C.

A heat-resistant conductive layer 908 for forming gate electrodes is formed to a thickness of 200 to 400 nm (preferably, 250 to 350 nm) on the gate insulating film 907. The heat-resistant conductive layer 908 may have a single-layered structure, or may have a multi-layered structure of a plurality of layers (e.g., two or three layers), if required. The heat-resistant conductive layer 908 contains one element selected from the group consisting of Ta, Ti and W, an alloy containing the element, or an alloy film of a combination of the elements. These heat-resistant conductive layers are formed by sputtering or CVD. In order to lower a resistance, the concentration of an impurity contained in the heat-resistant layer is preferably reduced. In particular, the concentration of oxygen is preferably set to be 30 ppm or less. In the present embodiment, a W film is formed to a thickness of 300 nm. The W film may be formed by sputtering, using W as a target, or can be formed by thermal CVD, using tungsten hexafluoride ($WF_6$). In any case, in order to use the film as a gate electrode it is required to lower a resistance. The resistance of the W film is desirably set to be 20 μΩcm or less. The resistance of the W film can be lowered by enlarging crystal grains. However, in the case where an impurity element such as oxygen is contained in W in a large amount crystallization is inhibited and the resistance is increased. Because of this, in the case of sputtering, a W target with a purity of 99.9 to 99.9999% is used, and care should be taken so that an impurity is not mixed from a vapor phase during film formation to form a W film whereby a resistance of 9 to 20 μΩcm can be realized.

On the other hand, in the case of using a Ta film for the heat-resistant conductive layer 908, the heat-resistant conductive layer 908 can be similarly formed by sputtering. The Ta film is formed using Ar as a sputtering gas. If an appropriate amount of Xe or Kr is added to a sputtering gas, the internal stress of a film to be formed is alleviated to prevent peeling of the film. The resistance of a Ta film in an a phase is about 20 μΩcm, so that such the Ta film can be used for a gate electrode. On the other hand, the resistance of a Ta film in a P phase is about 180 μΩcm, so that such the Ta film is unsuitable for a gate electrode. Since a TaN film has a crystalline structure closer to an α phase, if the TaN film is formed under the Ta film, a Ta film in an α phase is easily obtained. Although not shown in the figure, it is effective to form a silicon film doped with phosphorus (P) to a thickness of about 2 to 20 nm under the heat-resistant conductive layer 908. This enhances adhesion and prevents oxidation of the heat-resistant conductive layer 908 to be formed on the silicon film, and simultaneously prevents an alkali metal element present in a trace amount in the heat-resistant conductive layers 908 and 909 from diffusing to the first-shaped gate insulating film 907. In any case, the heat-resistant conductive layer 908 preferably has a resistance in a range of 10 to 50 μΩcm.

Furthermore, as another example of forming a gate electrode, a semiconductor film represented by a polycrystalline silicon film doped with an impurity element such as phosphorous may be used as a first conductive film. Furthermore, a gate electrode with a three-layered structure may be used. The three-layered structure may be formed by a combination of a tungsten (W) film as a first conductive film, a Cu film as a second conductive film, and a titanium (Ti) film as a third conductive film, a combination of a tantalum (TaN) film as the first conductive film, an aluminum (Al) film as the second conductive film, and the titanium (Ti) film as the third conductive film, a combination of the tantalum nitride (TaN) film as the first conductive film, the aluminum (Al) film as the second conductive film, and the titanium (Ti) film as the third conductive film, and a combination of the tantalum nitride (TaN) film as the first conductive film, the Cu film as the second conductive film, and the titanium (Ti) film as the third conductive film.

In the present embodiment, a TaN film was formed as the first conductive layer (first conductive film) 908 and a W film was formed as the second conductive layer (second conductive film) 909 (FIG. 7A).

Then, resist masks 910a for forming gate electrodes and a resist mask 910b for forming a secondary coil are formed by photolithography. A first etching process is conducted. The first etching process is conducted under the first and second etching conditions.

In the present embodiment, the first etching process is conducted in an ICP etching apparatus by generating plasma, using $Cl_2$, $CF_4$ and $O_2$ as an etching gas in a respective gas flow ratio of 25/25/10 (sccm) under a pressure of 1 Pa with an RF (13.56 MHz) power of 3.2 $W/cm^2$ supplied. An RF (13.56 MHz) power of 224 $mW/cm^2$ is also supplied to a substrate side (sample stage), whereby a substantially negative self-bias voltage is applied thereto. The W film is etched under the first etching condition. Then, etching is conducted under the second etching condition without removing the resist masks by generating plasma, using $CF_4$ and $Cl_2$ as an etching gas in a respective gas flow ratio of 30/30 (sccm) under a pressure of 1 Pa with an RF (13.56 MHz) power supplied. An RF (13.56 MHz) power of 20 W is also supplied to the substrate side (sample stage), whereby a substantially negative self-bias voltage is applied thereto.

Due to the first etching process, conductive layers 911 to 915 having a first taper shape are formed. The conductive layers 911 to 915 are formed so that a taper angle becomes 15° to 30°. In order to conduct etching without leaving a residue, overetching in which an etching time is increased by about 10 to 20% is conducted. Since a selection ratio of the silicon oxynitride film (gate insulating film 907) with respect to the W film is 2 to 4 (typically, 3), an exposed surface of the silicon oxynitride film is etched by about 20 to 50 nm by overetching.

Figure 7B:
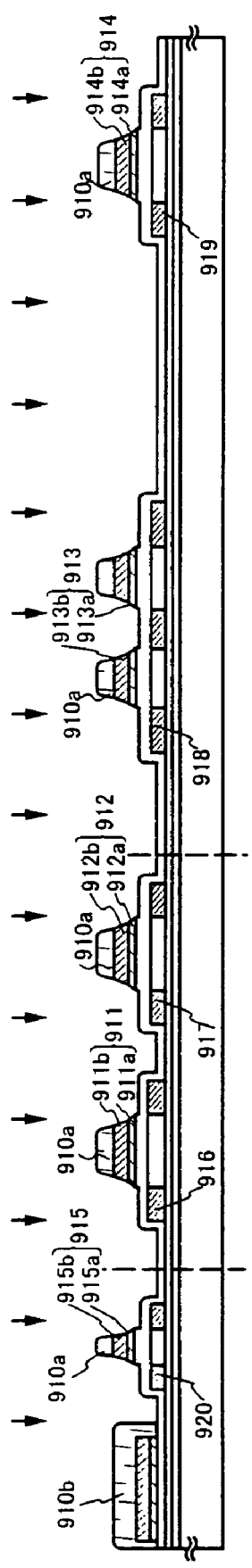

An impurity element with one conductivity is added to the semiconductor layers 902 to 906 by a first doping process. Herein, an n-type impurity element is added without removing the resist masks 910a. An impurity is added to a part of the semiconductor layers 902 to 906, using as a mask the conductive films 911 to 915 having a first taper shape in a self-alignment manner, whereby first n-type impurity regions 916 to 920 are formed. As an n-type impurity element, an element belonging to Group 15 (typically, phosphorus (P) or arsenic (As)) is used. Herein, an n-type impurity element is added to the first n-type impurity regions 916 to 920 in a concentration range of $1\times10^{20}$ to $1\times10^{21}$ atoms/cm$^3$ by ion doping, using phosphorus (P) (FIG. 7B).

Figure 7C:
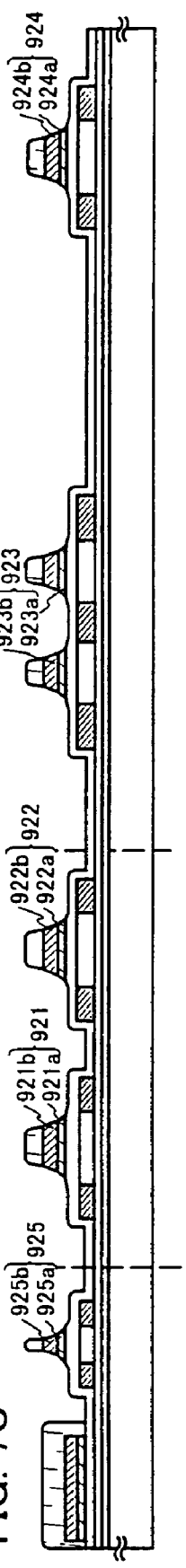

Then, the second etching process is conducted without removing the resist masks. The second etching process is conducted under third and fourth etching conditions. The second etching process is also conducted in an ICP etching apparatus in the same way as in the first etching process by generating plasma, using $CF_4$ and $Cl_2$ as an etching gas in a respective gas flow ratio of 30/30 (sccm) under a pressure of 1 Pa with an RF (13.56 MHz) power supplied. An RF (13.56 MHz) power of 20 W is also supplied to a substrate side (sample stage), whereby a substantially negative self-bias voltage is applied thereto. Under the third etching condition, conductive films 921 to 925 with the W film and the TaN film etched to a similar degree are formed (FIG. 7C).

Figure 7D:
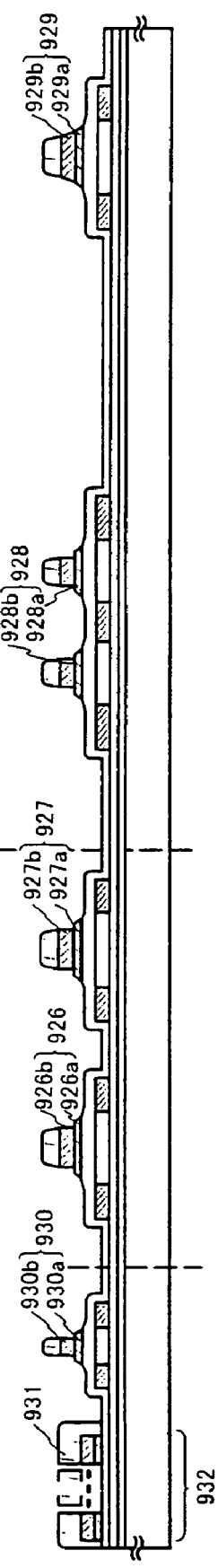

Thereafter, etching is conducted under the fourth etching condition without removing the resist masks by generating plasma, using a mixed gas of $CF_4$, $Cl_2$, and $O_2$ as an etching gas under a pressure of 1 Pa with an RF (13.56 MHz) power supplied. An RF (13.56 MHz) power of 20 W is also supplied to a substrate side (sample stage), whereby a substantially negative self-bias voltage is supplied thereto. The W film is etched under the fourth etching condition, whereby second-shaped conductive films 926 to 930 are formed (FIG. 7D).

In the present embodiment, a secondary coil may be formed by etching with a spiral mask, after all the etching processes for forming gate electrodes are completed. Therefore, regions where gate electrodes are to be formed are covered with a mask during etching. Furthermore, the spiral mask is formed so that a secondary coil has an outer diameter of 1 mm and an inner diameter of 0.5 mm. However, the shape of the secondary coil is not limited to a circular spiral shape, and may be appropriately determined by those skilled in the art. Furthermore, the number of secondary coils formed on each TFT substrate may be appropriately determined by those skilled in the art, together with a driving voltage of a TFT substrate. Furthermore, a method of forming a secondary coil is not limited to the present embodiment, and may be determined by those skilled in the art.

Figure 8A:
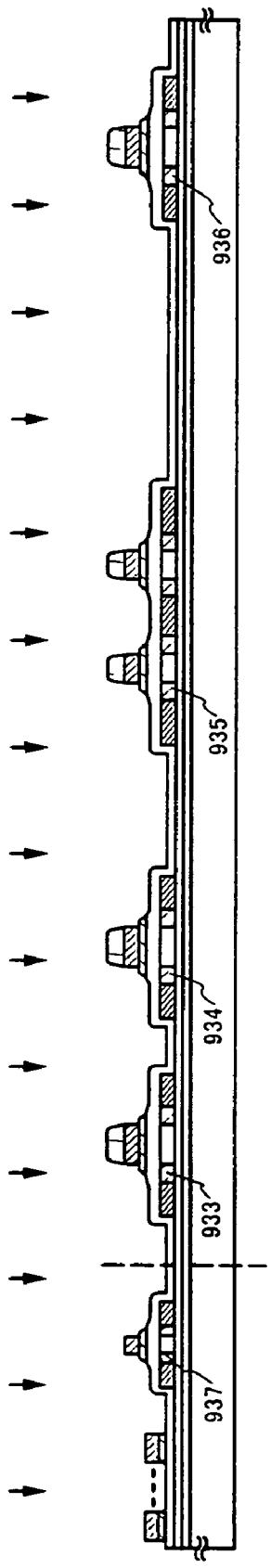
FIGS. 8A to 8C show an exemplary embodiment of the present invention.

Then, a second doping process (addition of an n-type impurity element to the semiconductor layers through second-shaped first conductive films 926a to 930a) is conducted, whereby second n-type impurity regions 933 to 937 are formed on the side of channel forming regions contacting the first n-type impurity regions 916 to 920. The concentration of an impurity in the second n-type impurity regions is set to be $1\times10^{16}$ to $1\times10^{19}$ atoms/cm$^3$. In the second doping process, conditions are adopted in which an n-type impurity element is added to the semiconductor layers even through taper portions of the second-shaped conductive films 926a to 930a as the first layers. In the present specification, the second n-type impurity regions overlapped with the second-shaped conductive films 926a to 930a as the first layers are referred to as $L_{ov}$ (ov means "overlapped") regions, and the second n-type impurity regions not overlapped with the second-shaped conductive films 926a to 930a as the first layers will be referred to as $L_{off}$ (off means "offset") (FIG. 8A).

Figure 8B:
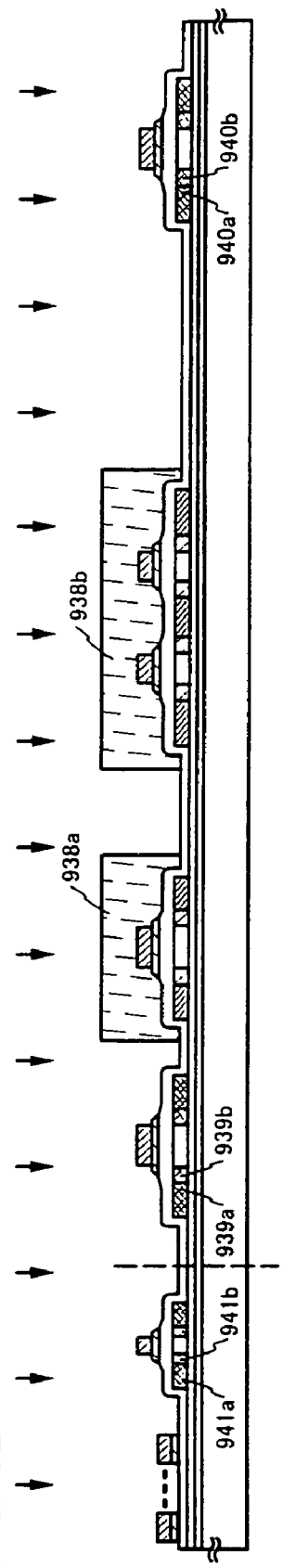

Then, as shown in FIG. 8B, impurity regions 939 (939a, 939b), 940 (940a, 940b), and 941 (941a, 941b) with a conductivity opposite to the above-mentioned conductivity are formed in the semiconductor layers 902, 905, and 906 to be active layers (semiconductor layers including channel forming regions and regions to be source/drain regions in which an impurity is added in a high concentration) of p-channel TFTs completed later. A p-type impurity element is added, using the second shaped conductive layers 926, 929, and 930 as a mask, whereby impurity regions are formed in a self-alignment manner. At this time, the entire surface of the semiconductor layers 903 and 904 to be active layers of n-channel TFT's completed later is covered with resist masks 938a and 938b. The p-type impurity regions 939, 940, and 941 are formed by ion doping using diborane ($B_2H_6$), and the concentration of a p-type impurity element of the p-type impurity regions 939, 940, and 941 is set to be $2\times10^{20}$ to $2\times10^{21}$ atoms/cm$^3$.

Specifically, an n-type impurity element is exactly added to the p-type impurity regions 939, 940, and 941. However, the concentration of a p-type impurity element in the p-type impurity regions 939, 940, and 941 is 1.5 to 3 times that of an n-type impurity element. Therefore, there is no problem for the p-type impurity regions 939, 940, and 941 to function as source and drain regions of p-channel TFTs.

Figure 8C:
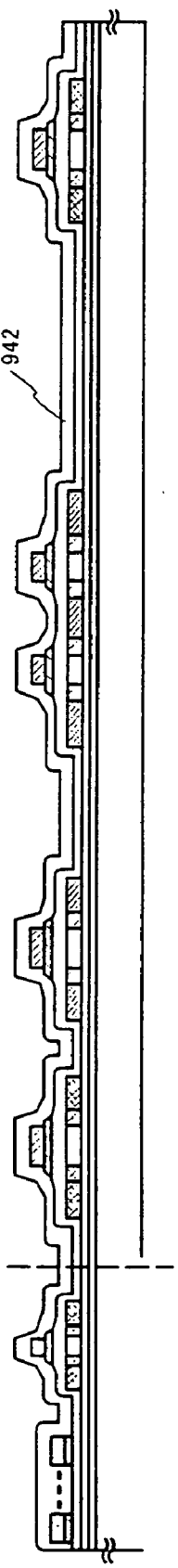

Thereafter, as shown in FIG. 8C, a first interlayer insulating film 942 is formed on the second-shaped conductive layers 926 to 930 and the gate insulating film. The first interlayer insulating film 942 may be made of a silicon nitride film, a silicon oxide film, a silicon oxynitride film, or a layered film of a combination thereof. In any case, the first interlayer insulating film 942 is made of an inorganic insulating material. The thickness of the first interlayer insulating film 942 is set to be 100 to 200 nm. In the case of using a silicon oxide film as the first interlayer insulating film 942, the first interlayer insulating film 942 can be formed by plasma CVD, mixing TEOS with $O_2$ and conducting discharge under a reaction pressure of 40 Pa, a substrate temperature of 300° C. to 400° C., and a high frequency (13.56 MHz) power density of 0.5 to 0.8 W/cm$^2$. In the case of using a silicon oxynitride film as the first interlayer insulating film 942, a silicon oxynitride film made of $SiH_4$, $N_2O$. and $NH_3$, or a silicon oxynitride film made of $SiH_4$ and $N_2O$ may be formed by plasma CVD. The film formation condition in this case is as follows: a reaction pressure of 20 to 200 Pa, a substrate temperature of 300° C. to 400° C., and a high frequency (60 MHz) power density of 0.1 to 1.0 W/cm$^2$. As the first interlayer insulating film 942, an oxidized, nitrided and hydro generated silicon film made of $SiH_4$, $N_2O$, and $H_2$ may be used. A silicon nitride film can be also formed of $SiH_4$ and $NH_3$ by plasma CVD.

An n-type or p-type impurity element added in the respective concentrations is activated. This process is conducted by thermal annealing using an annealing furnace. In addition, laser annealing or rapid thermal annealing (RTA) can be used. Thermal annealing is conducted at 400° C. to 700° C. (typically, 500° C. to 600° C.) in a nitrogen atmosphere with an oxygen concentration of 1 ppm or less (preferably, 0.1 ppm or less). In the present embodiment, a heat treatment was conducted at 550° C. for 4 hours. Furthermore, in the case of using a plastic substrate with a low heat-resistant temperature as the substrate 900, laser annealing is preferably used.

During the above-mentioned heat treatment, a catalytic element (nickel) used in the process of crystallizing the semiconductor layer is moved (gettered) to the first n-type impurity regions in which an element (phosphorus in the present embodiment mode) belonging to Group 15 in the periodic table having a gettering function is added in a high concentration, whereby the concentration of the catalytic element in the channel forming regions can be reduced.

After the activation process, an atmosphere gas is changed, and a heat treatment is conducted at 300° C. to 450° C. for 1 to 12 hours in an atmosphere containing 3 to 100% hydrogen, whereby the semiconductor layers are hydrogenated. During this process, $10^{16}$ to $10^{18}$/cm$^3$ of dangling bonds in the semiconductor layers are terminated with thermally excited hydrogen. As another means for hydrogenation, plasma hydrogenation (using hydrogen exited with plasma) may be conducted. In any case, the defect density in the semiconductor layers 902 to 906 is desirably set to be $10^{16}$/cm$^3$ or less. In order to achieve this, hydrogen may be added in an amount of about 0.01 to 0.1 atomic %.

A second interlayer insulating film 943 made of an organic insulating material is formed to an average thickness of 1.0 to 2.0 μm. As the organic resin material, polyimide, acrylic resin, polyamide, polyimide-amide, BCB (benzocyclobutene), or the like can be used. For example, in the case of using polyimide that is thermally polymerized, after being applied to a substrate the second interlayer insulating film 943 is formed by sintering at 300° C. in a clean oven. In the case of using acrylic resin, a 2-liquid type is used. In this case, a main material is mixed with a curing agent, and thereafter, the entire surface of a substrate is coated with the mixture with a spinner. Then, the resultant substrate is provisionally heated at 80° C. for 60 seconds on a hot plate, followed by sintering at 250° C. for 60 minutes in a clean oven.

As described above, by forming the second interlayer insulating film 943 of an organic insulating material, the surface can be satisfactorily flattened. Furthermore, the organic resin material generally has a low dielectric constant, so that a parasitic capacitance can be reduced. However, the organic resin material is not suitable as a protective film due to its moisture-absorption characteristic. Therefore, the organic insulating material may be combined with a silicon oxide film, a silicon oxynitride film, or a silicon nitride film formed as the first interlayer insulating film 942, as in the present embodiment. Furthermore, in the present embodiment, the second interlayer insulating film 943 is made of an organic insulating material. However, it may also be possible that a film is formed of an inorganic insulating material, its surface is flattened by CMP or the like, and the film thus obtained is used as the second interlayer insulating film 943.

Note that the second interlayer insulating film 943 made of the organic insulating material may generate moisture and gas in some cases. It is known that a light-emitting element is likely to be degraded with moisture and gas (oxygen). It is considered that due to the heat generated by a light-emitting device while the apparatus is actually used, which is obtained by using an organic resin insulating film for an interlayer insulating film, moisture and gas are generated from the organic resin insulating film, and the light-emitting element becomes likely to be degraded with the moisture and gas. In order to avoid this, an insulating film 944 is formed on the second interlayer insulating film 943 formed of an organic insulating material. The insulating film 944 is made of a silicon oxide film, a silicon oxynitride film, a silicon nitride film or the like. The insulating film 944 may be formed by sputtering or plasma CVD. The insulating film 944 may also be formed after forming contact holes.

Thereafter, a resist mask with a predetermined pattern is formed, and contact holes are formed so as to reach impurity regions to be a source region or a drain region formed in each semiconductor layer. The contact holes are formed by dry etching.

Then, a conductive metal film is formed by sputtering or vacuum vapor deposition, and patterned with a mask, followed by etching, whereby wirings 945 to 952 are formed. Although not shown in the figure, in the present embodiment, each of the wirings 945 to 952 is made of a layered film of a Ti film (thickness: 50 nm) and an alloy (Al and Ti) film (thickness: 500 nm).

A transparent conductive film is formed on the wiring to a thickness of 80 to 120 nm, and etched to form a pixel electrode (anode) 953 (FIG. 9A). In the present embodiment, as a transparent electrode, an indium tin oxide (ITO) film or a transparent conductive film in which zinc oxide (ZnO) is mixed with 2 to 20% indium oxide is used.

Furthermore, the anode 953 is overlapped with a drain wiring 950 so as to be in contact therewith, thereby being electrically connected to a drain region of a current control TFT. Herein, the anode 953 may be heat-treated at 180° C. to 350° C.

Next, as shown in FIG. 9B, an organic insulating film 954 is formed on the anode 953.

At this time, in order to prevent the array substrate with TFTs formed thereon from being damaged or contaminated with dust in the air, a very thin film (hereinafter, referred to as an "antistatic film") 955 having an antistatic function is formed on the organic insulating film 954. The antistatic film 955 is made of a known material that can be removed by washing with water (FIG. 9C). In the present embodiment, staticide (produced by ACL) was applied to form the antistatic film 955.

Then, an inspection is conducted so as to determine the quality (suitability of a TFT substrate for a product) of TFTs on the array substrate thus produced. A material for a light-emitting element is expensive. Therefore, it is not desirable in terms of manufacturing cost to form a light-emitting element on a TFT substrate that cannot be delivered as a product. In order to identify a TFT substrate that cannot be normally driven or transmit a signal, an inspection process is incorporated. The inspection method as described in Embodiment mode 1 or 2 may be applied.

After the TFT substrate is transported to a treatment chamber (clean room) for forming light-emitting elements, the antistatic film 955 is removed by washing with water. Then, the organic insulating film 954 is etched to form a bank 956 having an opening at a position corresponding to a pixel (light-emitting element). In the present embodiment, the bank 956 is formed of a resist. In the present embodiment, the thickness of the bank 956 is set to be about 1 µm, and a region of the bank 956 covering a portion where the wiring is in contact with the anode is tapered (FIG. 10A).

In the present embodiment, although the bank 956 is made of a resist film, in some cases, polyimide, polyamide, acrylic resin, BCB (benzocyclobutene), or a silicon oxide film can be used. The bank 956 may be formed of an organic substance or an inorganic substance as long as it is an insulative substance. In the case of forming the bank 956 using photosensitive acrylic resin, it is preferable that the photosensitive acrylic film is etched and heat-treated at 180° C. to 350° C. In the case of forming the bank 956 using a non-photosensitive acrylic film, it is preferable that the non-photosensitive acrylic film is heat-treated at 180° C. to 350° C., and etched to form the bank.

Next, the surface of the anode is subjected to a wiping treatment. In the present embodiment, the surface of the anode 953 is swept with a Bellclean 961 (produced by Odzu Sangyo), whereby the surface of the anode 953 is flattened and dust adhering thereto is removed. As a cleaning agent for wiping, pure water is used. The rotation number of an axis around which the Bellclean is wound is set to be 100 to 300 rpm, and a push-in value is set to be 0.1 to 1.0 mm (FIG. 10A).

Then, an insulating film 957 is formed so as to cover the bank 956 and the anode 953. As the insulating film 957, an organic resin film made of polyimide, polyamide, or polyimide-amide is formed to a thickness of 1 to 5 nm by spin coating, vapor deposition, or sputtering. The insulating film 957 thus formed can cover cracks and the like on the surface of the anode 953, thereby preventing the light-emitting element from being degraded.

Thereafter, the array substrate is separated into a plurality of TFT substrates by a known method. At this time, it is preferable that the transformer's secondary coil, the rectifier circuit, and the waveform shaping circuit formed outside of a region of the TFT substrate to be a product and used in the inspection process are electrically and physically separated. In the present embodiment, the transformer's secondary coil, the rectifier circuit, and the waveform shaping circuit are formed outside of the region of the TFT substrate to be a product. However, the place for forming these elements may be appropriately determined by those skilled in the art, and is not limited to the present embodiment.

Then, an organic compound layer 958 and a cathode 959 are formed by vapor deposition on the insulating film 957 of a TFT substrate capable of using as a product. In the present embodiment, as the cathode of the light-emitting element, an MgAg electrode is used; However, another known material may be used. The organic compound layer 958 is formed by stacking a combination of a plurality of layers including not only light-emitting layers but also a hole injection layer, a hole transport layer, an electron transport layer, and an electron injection layer. The configuration of the organic compound layer 958 used in the present embodiment will be described below in detail.

In the present embodiment, the hole injection layer is formed of copper phthalocyanine, and the hole transport layer is formed of α-NPD by vapor deposition, respectively.

Then, light-emitting layers are formed. In the present embodiment, an organic compound layer exhibiting different light emission is formed by using different materials for the light-emitting layers. In the present embodiment, an organic compound layer emitting red, green and blue light is formed. Since vapor deposition is used for a film-formation in any case, light-emitting layers can be formed by using materials varied depending upon the pixel, using a metal mask when forming a film.

A light-emitting layer emitting red light is formed by using $Alq_3$ doped with DCM. In addition, (N,N'-disalicylidene-1, 6hexanediaminate)zinc(II)(Zn(salhn)) doped with (1,10-phenanthroline)tris(1,3-diphenyl-propane-1,3-dionate)europium(III)($Eu(DBM)_3(Phen)$) that is an Eu complex, or the like can be used. The other known materials can also be used.

A light-emitting layer emitting green light can be formed by covapor deposition of CBP and $Ir(ppy)_3$. In this case, it is preferable that the hole blocking layer is stacked by using BCP. In addition, an alumiquinolinolato complex ($Alq_3$) or a benzoquinolinate beryllium complex (BeBq) can be used. Furthermore, a quinolinolato aluminum complex ($Alq_3$) using a material such as coumarin 6 or Quinacridone as a dopant can be used. The other known materials can also be used.

Furthermore, as a light-emitting layer emitting blue light, DPVBi that is a distyryl derivative, N,N'-disalicylidene-1,6-hexanediaminato)zinc(II)(Zn(salhn)) that is a zinc complex having an azomethine compound as a ligand, and 4,4'-bis(2, 2-diphenyl-vinyl)-biphenyl(DPVBi) doped with perylene can be used. However, the other known materials may be used.

Next, the electron transport layer is formed. As the electron transport layer, a material such as a 1,3,4-oxadiazole derivative, a 1,2,4-triazole derivative (TAZ), or the like can be used. In the present embodiment, the electron transport layer is formed of a 1,2,4-triazole derivative (TAZ) to a thickness of 30 to 60 nm by vapor deposition.

As described above, the organic compound layer with a layered structure is formed. In the present embodiment, the thickness of the organic compound layer 958 is set to be 10 to 400 nm (typically, 60 to 150 nm), and the thickness of the cathode 959 is set to be 80 to 200 nm (typically, 100 to 150 nm).

After the organic compound layer is formed, the cathode 959 of the light-emitting element is formed by vapor deposition. In the present embodiment, as a conductive film to be the cathode of the light-emitting element, MgAg is used. However, an Ai-Li alloy film (alloy film of aluminum and lithium), or a film formed by covapor deposition of an element belonging to Group 1 or 2 in the periodic table and aluminum can also be used as the conductive film.

Thus, a light-emitting device having a configuration as shown in FIG. 10B is completed. A portion 960 where the anode 953, the organic compound layer 958, and the cathode 959 are stacked on top each other is referred to as a light-emitting element.

A p-channel TFT 1000 and an n-channel TFT 1001 are TFTs of a driving circuit 102, which constitute a CMOS. A switching TFT 1002 and a current control TFT 1003 are TFTs of a pixel portion 103, and the TFTs of the driving circuit 102 and the TFTs of the pixel portion 103 can be formed on the same substrate.

In the case of a light-emitting device using a light-emitting element the voltage of a power source of the driving circuit is enough to be about 5V to 6V (at maximum, about 10V), so that TFTs are unlikely to be degraded with hot electrons.

In the present embodiment, an example of forming a transformer's secondary coil used in the inspection process on a TFT substrate (TFT element substrate) of a light-emitting device has been described. The present embodiment is not limited to the light-emitting device, and it is possible to form a transformer's secondary coil for applying the present invention onto an element substrate of a semiconductor device made of a semiconductor element, such as a liquid crystal display device.

Embodiment 2

In Embodiment 2, the same processes as those in Embodiment 1 are conducted to form the second interlayer insulating film 943, and instead of forming the insulating film 944 in Embodiment 1, the second interlayer insulating film 943 is subjected to a plasma treatment to modify the surface of the second interlayer insulating film 943. This method will be described with reference to FIGS. 11 to 13.

Figure 11:
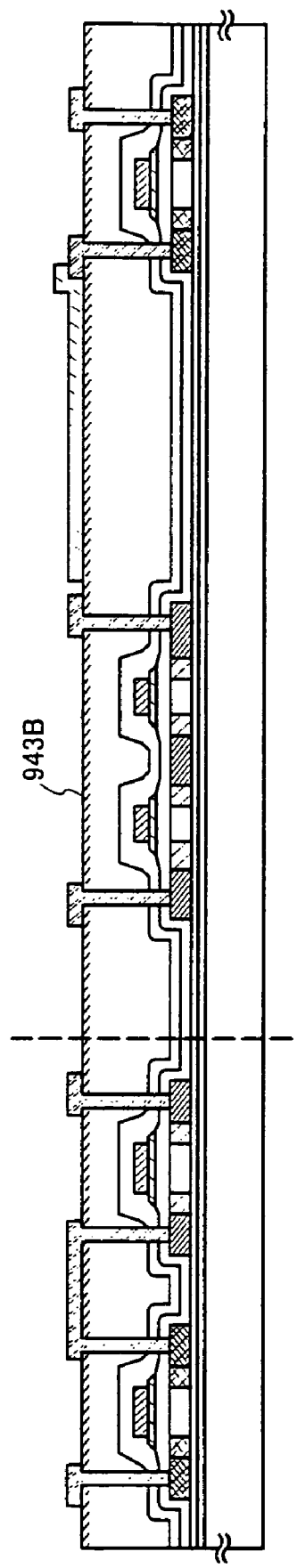
FIG. 11 shows an exemplary embodiment of the present invention.

For example, the second interlayer insulating film 943 is subjected to a plasma treatment in one or a plurality of kinds of gases selected from the group consisting of hydrogen, nitrogen, hydrocarbon, halidecarbon, hydrogen fluoride, and rare gas (Ar, He, Ne, etc.), whereby a new coating film is formed on the surface of the second interlayer insulating film 943, and the kind of a functional group present on the surface is changed. Thus, the surface of the second interlayer insulating film 943 can be modified. On the surface of the second interlayer insulating film 943, a dense film 943B is formed as shown in FIG. 11. In the present specification, the film 943B is referred to as a cured film 943B. Because of this, the organic resin film is prevented from releasing gas and moisture.

Furthermore, in the present embodiment, the anode (ITO) is formed after the surface of the second interlayer insulating film 943 is modified, which prevents a heat treatment from being conducted under the condition that materials with different thermal expansion coefficients are directly in contact with each other. Therefore, cracks and the like of ITO can be prevented, which prevents the light-emitting element from being degraded. The second interlayer insulating film 943 may be subjected to a plasma treatment either before or after contact holes are formed.

The cured film 943B is formed by subjecting the surface of the second interlayer insulating film 943 made of an organic insulating material to a plasma treatment in one or a plurality of kinds of gases selected from the group consisting of hydrogen, nitrogen, hydrocarbon, halidecarbon, hydrogen fluoride, and rare gas (Ar, He, Ne, etc.). Therefore, it is considered that the cured film 943B contains a gas element of hydrogen, nitrogen, hydrocarbon, halidecarbon, hydrogen fluoride, or rare gas (Ar, He, Ne, etc.).

Figure 12:
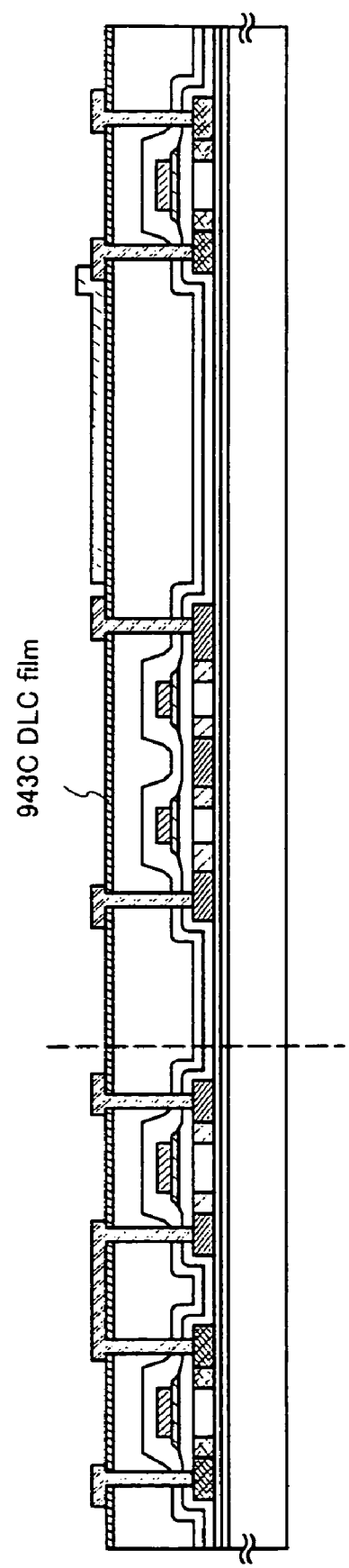
FIG. 12 shows an exemplary embodiment of the present invention.

Furthermore, as another example, as shown in FIG. 12, the processes are conducted in the same way as in Embodiment 1 to form the second interlayer insulating film 943, and then, a diamond-like carbon (DLC) film 943C may be formed as the insulating film 944 on the second interlayer insulating film 943.

The DLC film has an asymmetric peak at about 1550 cm$^{-1}$ and a Raman spectrum distribution with a shoulder at about 1300 cm$^{-1}$. Furthermore, the DLC film exhibits a hardness of 15 to 25 GPa when measured by a microhardness meter, and is excellent in chemical resistance. Furthermore, the DLC film can be formed by CVD or sputtering at a temperature in a range of room temperature to 100° C. As a film formation method, sputtering, ECR plasma CVD, high-frequency plasma CVD, or ion beam vapor deposition may be used, and the thickness may be about 5 to 50 nm.

Figure 13:
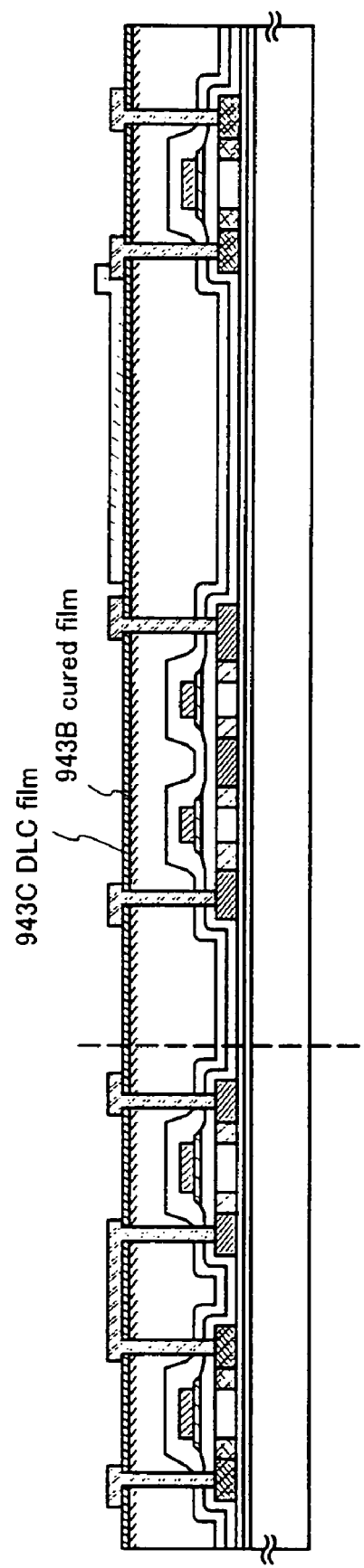
FIG. 13 shows an exemplary embodiment of the present invention.

As still another example, as shown in FIG. 13, the following may be possible: the processes are conducted in the same way as in Embodiment 1 to form the second interlayer insulating film 943; the surface of the second interlayer insulating film 943 is modified by a plasma treatment to form the cured film 943B; and, thereafter, a DLC film 943C is formed on the cured film 943B. The DLC film 943C may be formed to have a thickness of about 5 to 50 nm by sputtering, ECR plasma CVD, high-frequency plasma CVD, or ion beam vapor deposition.

Embodiment 3

In Embodiment 3, the processes are conducted in the same way as in Embodiment 1 to form the bank 956, and the surface of the bank 956 is subjected to a plasma treatment, whereby the surface of the bank 956 is modified. This will be described with reference to FIG. 14.

The bank 956 is made of an organic resin insulating film, which has a problem of generating moisture and a gas. The bank 956 is likely to generate moisture and a gas due to the heat generated when a light-emitting device is actually used.

Figure 14:
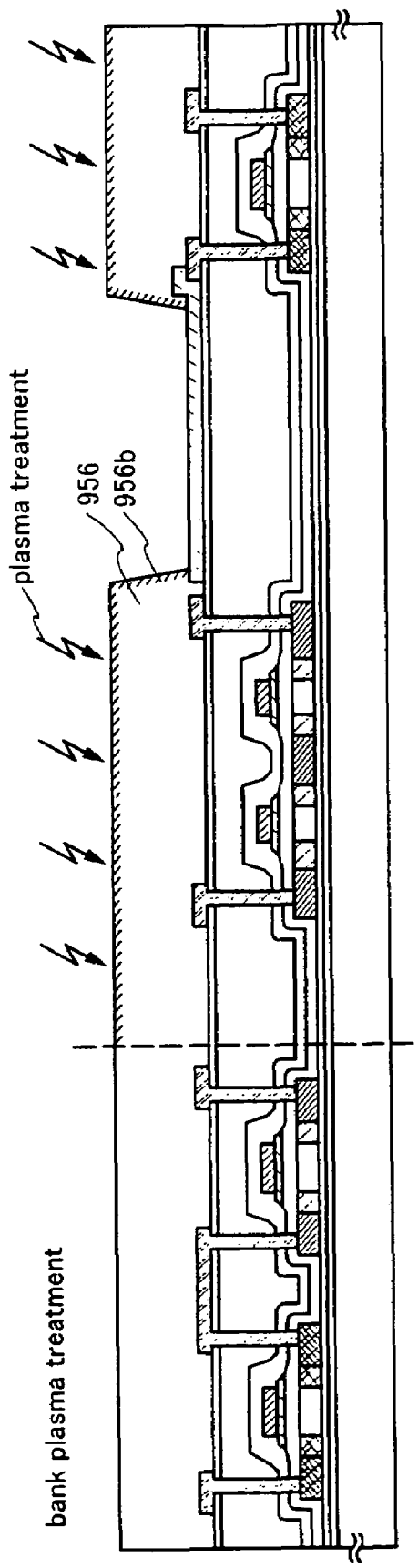
FIG. 14 shows an exemplary embodiment of the present invention.

In order to overcome this problem, after the heat treatment, a plasma treatment is conducted so as to modify the surface of the bank 956 as show in FIG. 14. A plasma treatment is conducted in one or a plurality of kinds of gases selected from the group consisting of hydrogen, nitrogen, halidecarbon, hydrogen fluoride, and rare gas.

Because of the above, the surface of the bank 956 is made dense, and a cured film 956b containing one or a plurality of kinds of gas elements selected from hydrogen, nitrogen, halidecarbon, hydrogen fluoride, and rare gas is formed, which can prevent moisture and a gas (oxygen) from being generated from the inside, thereby preventing the light-emitting element from being degraded.

The present embodiment can be combined with any one of Embodiments 1 to 4.

Embodiment 4

The present invention is applicable to any shape of TFTs. In the present embodiment, a method of manufacturing a light-emitting device in which a bottom-gate type TFT is formed will be described with reference to FIGS. 15A-15C and 16A-16C.

A base insulating film 51 is formed of a material selected from a silicon oxide film, a silicon nitride film, and a silicon oxynitride film on an array substrate 50. A conductive film made of an element selected from Ta, Ti, W, Mo, Cr, and Al or mainly containing any one of the elements is formed, and patterned into a desired shape to obtain a gate electrode 52. Then, a gate insulating film 53 is formed, which has a single-layered structure of a silicon oxide film, a silicon nitride film or a silicon oxynitride film, or a multi-layered structure of any of the films. Then, an amorphous silicon film is formed to have a thickness of 10 to 150 nm as an amorphous semiconductor film by a known method. The gate insulating film 53 and the amorphous silicon film can be formed by the same film formation method, so that they may be formed continuously. By continuously forming these films, they are formed without being exposed to the atmosphere once, thereby preventing the surface thereof from being contaminated, and reducing variations in characteristics of TFTs to be produced and fluctuations in a threshold voltage.

Then, the amorphous semiconductor film is crystallized to obtain a crystalline semiconductor film 54. The crystallization process may be conducted by irradiation with a laser, a heat treatment, or a combination thereof. After the crystallization process, an insulating film (not shown) that protects the crystalline silicon film (channel forming region) in the later process of adding an impurity is formed to have a thickness of 100 to 400 nm. The insulating film is formed for the purpose of preventing the crystalline silicon film from being directly exposed to plasma during addition of an impurity element and enabling the concentration of the impurity element to be minutely controlled.

Then, using a resist mask, an n-type impurity element is added to the crystalline silicon film to be an active layer of the TFT later and a source/drain region 55 of the TFT is formed.

Then, the impurity element added to the crystalline silicon film is activated. In the case of conducting the crystallization process, using a catalytic element, the catalytic element applied to the crystalline silicon film can be gettered in the same process as that of activation. The atmosphere for the heat treatment may be put under a reduced pressure by exhaustion with a rotary pump or a mechanical booster pump.

Then, the insulating film on the crystalline silicon film is removed, and the crystalline silicon film is patterned into a desired shape. Thereafter, an insulating film 56 is formed. The insulating film 56 is made of an inorganic insulating film such as a silicon oxide film, a silicon nitride film, a silicon oxynitride film, or the like, or an organic resin material selected from polyimide, acrylic resin, polyamide, polyimide-amide, epoxy resin, and BCB (benzocyclobutene).

Thereafter, contact holes are formed so as to reach the source/drain region of the respective TFTs, and a wiring 57 for electrically connecting each TFT is formed of aluminum or a conductive film mainly containing aluminum. Then, an interlayer insulating film 58 is formed so as to cover the wiring 57. The interlayer insulating film 58 may be formed of an inorganic insulating film such as a silicon oxide film, a silicon nitride film, and a silicon oxynitride film, or an organic resin material selected from polyimide, acrylic resin, polyamide, polyimide-amide, epoxy resin, and BCB (benzocyclobutene).

Figure 15A:
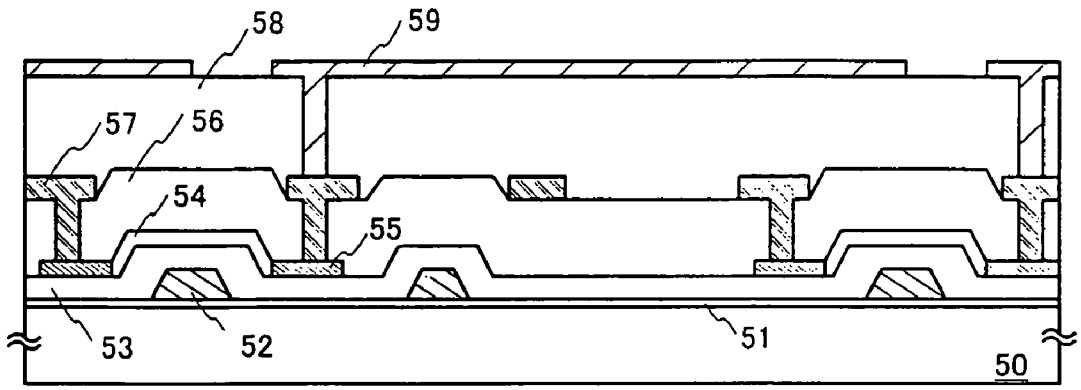
FIGS. 15A to 15C show an exemplary embodiment of the present invention.
Figure 15B:
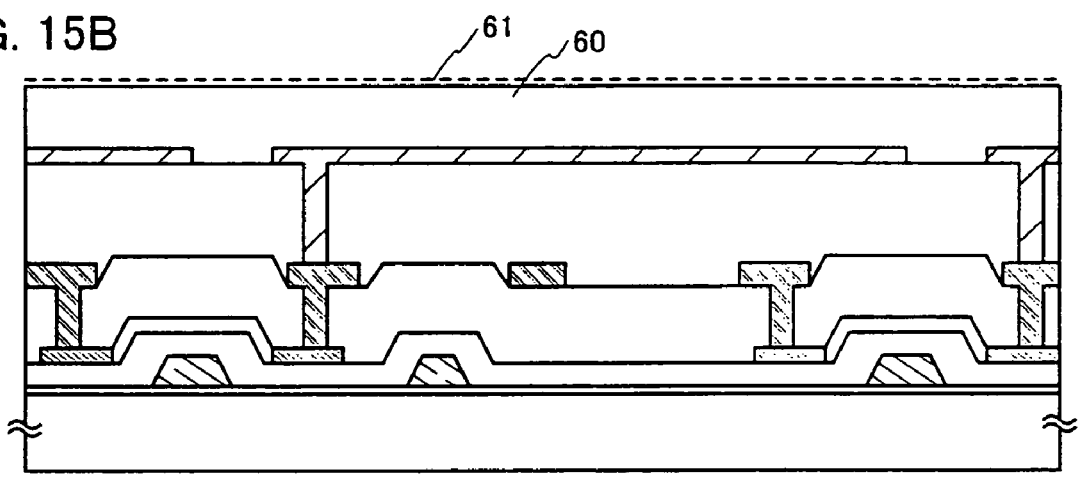

Then, a pixel electrode 59 to be an anode of a light-emitting element is formed of a conductive film. As the conductive film, metal selected from chromium, molybdenum, tungsten, tantalum, and niobium may be used (FIG. 15A).

Thereafter, an organic insulating film 60 for forming a bank (in the present specification, an insulating film having an opening portion on a pixel electrode and formed so as to cover an end of the pixel electrode will be referred to as a bank) is formed (FIG. 15B), and an antistatic film 61 may be formed on the surface of the organic insulating film 60 for the purpose of an antistatic function. The antistatic film 61 is formed so as to prevent dust from adhering to a TFT substrate during a later inspection process.

Then, an inspection process is conducted so as to inspect the operation of TFTs formed on the array substrate to determine if the TFTs are suitable for products. The inspection method described in Embodiment mode 1 or 2 may be used.

Figure 15C:
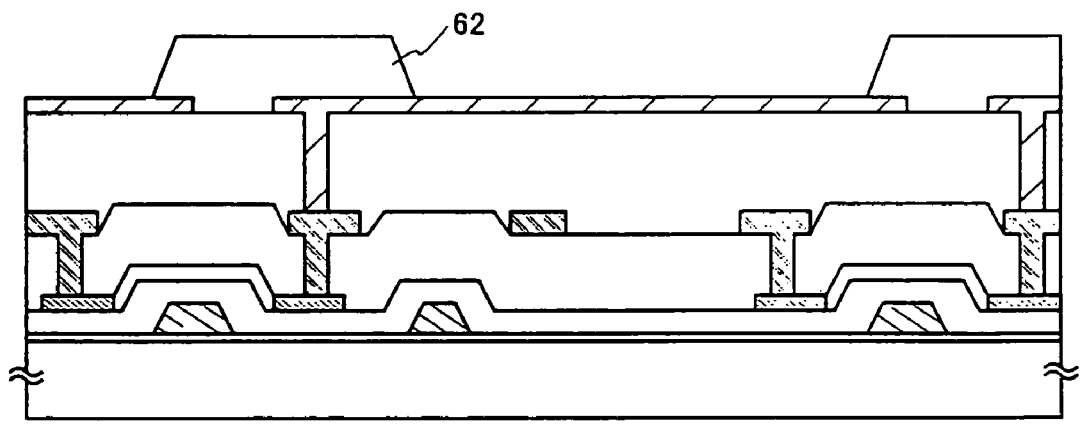

After the inspection process is completed, the antistatic film 61 is removed by washing with water or the like, and the organic insulating film 60 is etched to form a bank 62 (FIG. 15C).

An organic compound layer 63 and a cathode 64 are formed on a TFT substrate determined to be suitable for a product in the above-mentioned inspection process.

Figure 16A:
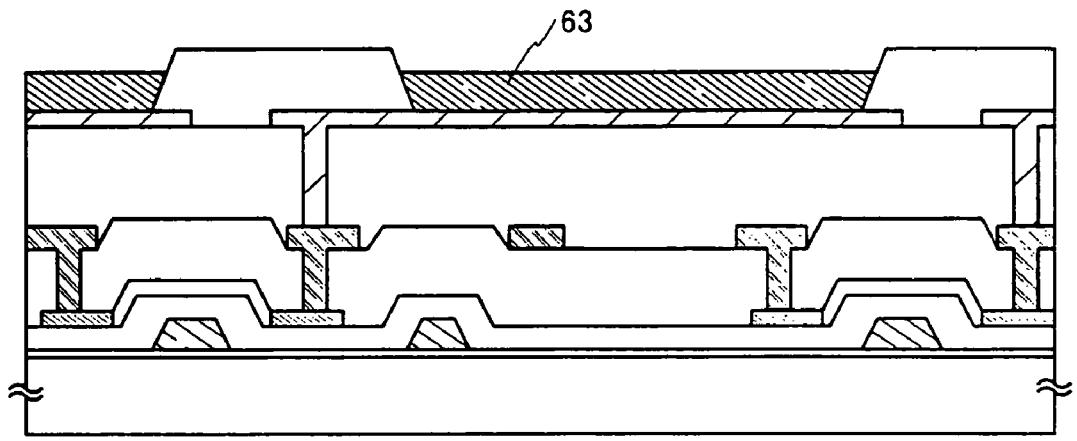
FIGS. 16A to 16C show an exemplary embodiment of the present invention.

The organic compound layer 63 is formed by stacking a combination of a plurality of layers including a hole injection layer, a hole transport layer, a hole blocking layer, an electron transport layer, and an electron injection layer, as well as a light-emitting layer. The thickness of the organic compound layer 63 is preferably about 10 to 400 nm (FIG. 16A).

Figure 16B:
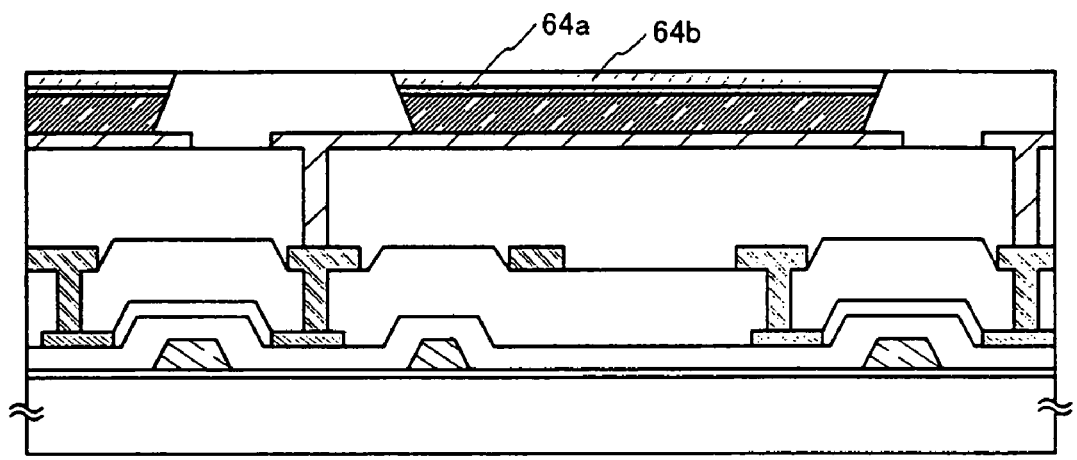

A cathode 64 is formed after forming the organic compound layer 63. The cathode 64 has a double-layered structure in which a very thin (20 nm or less) cathode 64a is formed using MgAg or an Al—Li alloy (alloy of aluminum and lithium) as a first layer, and a transparent conductive film 64b is formed on the cathode 64a to have a thickness of 80 to 200 nm (FIG. 16B).

Figure 16C:
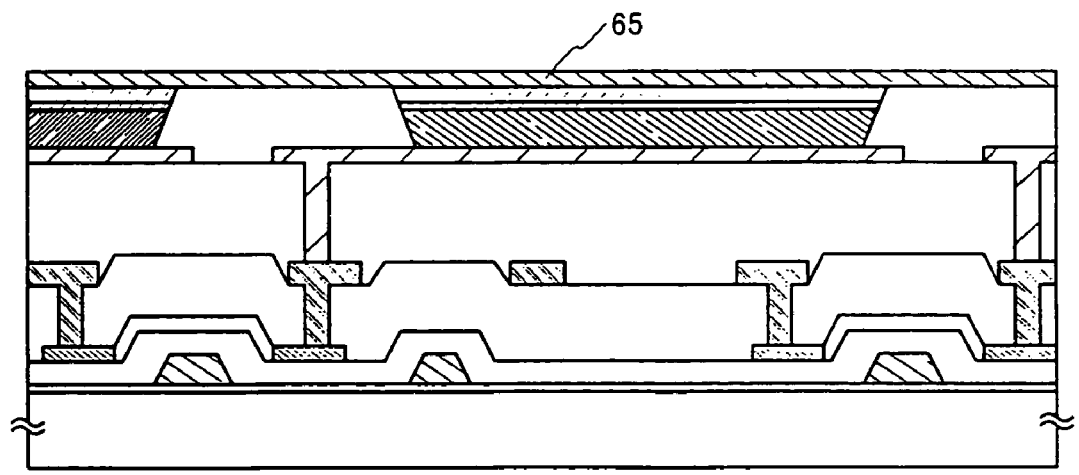

Then, a protective film 65 is formed so as to cover the bank 62 and the cathode 64. The protective film 65 may be formed any one of a DLC film, a silicon oxide film, or a silicon nitride film, which the film is formed so as to contain Ar (FIG. 16C).

As described above, a light-emitting device can be manufactured by using a plurality of TFT substrates formed on an array substrate.

Embodiment 5

In Embodiment 5, a method of crystallizing a semiconductor film to be an active layer of a TFT, using a catalytic element, and reducing the concentration of the catalytic element in the obtained crystalline semiconductor film will be described.

Figure 24A:
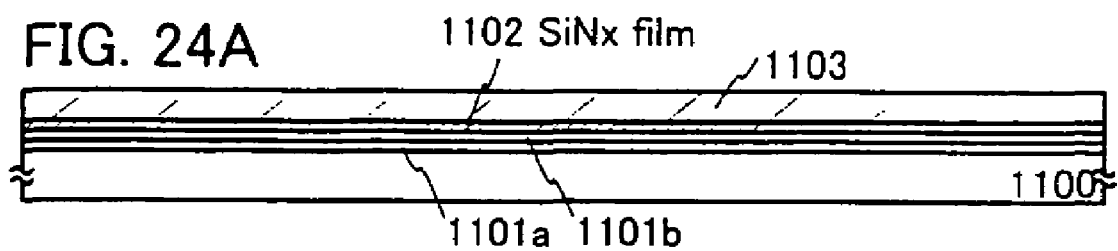
FIGS. 24A to 24F show an exemplary embodiment of the present invention.

In FIG. 24A, a substrate 1100 is preferably made of barium borosilicate glass, aluminoborosilicate glass, or quartz. On the surface of the substrate 100, an inorganic insulating film is formed as a base insulating film 1101 to have a thickness of 10 to 200 nm. A preferable example of the base insulating film 1101 is a silicon oxynitride film produced by plasma CVD. The base insulating film 1101 is obtained by forming a first silicon oxynitride film 1101a made of $SiH_4$, $NH_3$, and $N_2O$ (thickness: 50 nm), and forming a second silicon oxynitride film 1101b made of $SiH_4$ and $N_2O$ (thickness: 100 nm). The base insulating film 1101 (1101a, 1101b) is provided for the purpose of preventing alkali metal contained in an array substrate from diffusing to a semiconductor film to be formed in an upper layer. In the case of using a quartz substrate, the base insulating film 1101 may be omitted.

Then, a silicon nitride film 1102 is formed on the base insulating film 1101. The silicon nitride film 1102 is formed for the purpose of preventing a catalytic element (typically, nickel) used in a later crystallization process of a semiconductor film from being drunk on the base insulating film 1101, and further preventing oxygen contained in the base insulating film 1101 from having an adverse effect. The silicon nitride film 1102 may be formed to have a thickness of 1 to 5 nm by plasma CVD.

Then, an amorphous semiconductor film 1103 is formed on the silicon nitride film 1102. A semiconductor material mainly containing silicon is used for the amorphous semiconductor film 1102. Typically, an amorphous silicon film, an amorphous silicon germanium film, or the like is applied for the amorphous semiconductor film 1103 and formed to have a thickness of 10 to 100 nm by plasma CVD, reduced-pressure CVD, or sputtering. In order to obtain crystal of good quality, the concentration of an impurity such as oxygen and nitrogen contained in the amorphous semiconductor film 1103 may be reduced to $5 \times 10^{18}/\text{cm}^3$ or less. These impurities inhibit crystallization of an amorphous semiconductor, and furthermore, increase the density of a trapping center and recombination center even after crystallization. Therefore, it is desirable to use not only a high-purity material gas but also a CVD apparatus designed for ultra-high vacuum, provided with a mirror surface treatment (field polishing treatment) system in a reaction chamber and an oil-free vacuum exhaust system. The films including the base insulating film 1101 to the amorphous semiconductor film (amorphous silicon film) 1103 can be formed continuously without being exposed to the atmosphere.

Figure 24B:
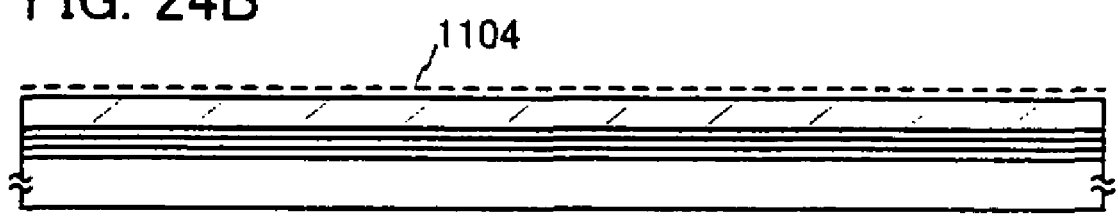

Thereafter, a metal element having a catalytic function for promoting crystallization is added to the surface of the amorphous silicon film 1103 (FIG. 24B). Examples of a metal element having a catalytic function of promoting crystallization of a semiconductor film include iron (Fe), nickel (Ni), cobalt (Co), ruthenium (Ru), rhodium (Rh), palladium (Pd), osmium (Os), iridium (Ir), platinum (Pt), copper (Cu), gold (Au), and the like. One or a plurality of kinds of metal elements selected from these examples can be used. Typically, nickel is used. A nickel acetate solution containing 1 to 100 ppm by weight of nickel is applied to the surface of the amorphous silicon film 1103 with a spinner to form a catalyst-containing layer 1104. In this case, in order to make the solution be applied to the surface of the amorphous silicon film 1103 more easily, the amorphous silicon film 1103 is subjected to a surface treatment. More specifically, a very thin oxide film is formed of an ozone-containing aqueous solution, and the oxide film is etched with a mixed solution containing fluoric acid and a hydrogen peroxide solution to form a clean surface. Thereafter, the resultant surface is treated with an ozone-containing aqueous solution again to form a very thin oxide film. The surface of the semiconductor film made of silicon or the like is originally hydrophobic; therefore, by forming such an oxide film, a nickel acetate solution can be applied uniformly.

Needless to say, the method of forming the catalyst-containing layer 1104 is not limited to the above. The catalyst-containing layer 1104 may be formed by sputtering, vapor deposition, a plasma treatment, or the like.

A heat treatment for crystallization is conducted under the condition that the amorphous silicon film 1103 is in contact with the catalyst-containing layer 1104. As a method of a heat treatment, furnace annealing using an electrothermal furnace, or RTA (Rapid Thermal Annealing) using a halogen lamp, a metal halide lamp, a xenon arc lamp, a carbon arc lamp, a high-pressure sodium lamp, a high-pressure mercury lamp, or the like is used.

Figure 24C:
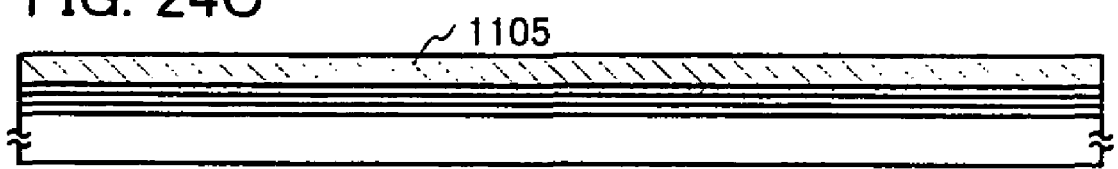

In the case of conducting RTA, a lamp light source for heating is lighted for 1 to 60 seconds (preferably, 30 to 60 seconds), and this cycle is repeated 1 to 10 times (preferably 2 to 6 times). A light-emission intensity of the lamp light source is arbitrarily determined in such a manner that the semiconductor film can be heated rapidly to about 600° C. to 1000° C., preferably about 650° C. to 750° C. Even at such a high temperature, the semiconductor film is only heated rapidly, and the substrate 1100 will not be deformed due to its strain. Thus, the amorphous semiconductor film is crystallized to obtain a crystalline silicon film 1105 as shown in FIG. 24C. The amorphous semiconductor film cannot be crystallized by such a treatment unless the catalyst-containing layer 1104 is formed.

In the case of using the furnace annealing as other method, prior to a heat treatment for crystallization, a heat treatment is previously conducted at 500° C. for about one hour so that hydrogen contained in the amorphous silicon film 1103 is released. Then, the heat treatment for crystallization is conducted at 550° C. to 600° C., preferably 580° C. for 4 hours in a nitrogen atmosphere, using an electrothermal furnace, thereby crystallizing the amorphous silicon film 1103. Thus, the crystalline silicon film 1105 as shown in FIG. 24C is formed.

Further, in order to increase a crystallization ratio (ratio of a crystal component in the entire volume of a film), and correct defects remaining in crystal grains, it is also effective to irradiate the crystalline silicon film 1105 with laser light.

In the crystalline silicon film 1105 thus obtained, a catalytic element (herein, nickel) remains in an average concentration exceeding $1 \times 10^{19}/\text{cm}^3$. The remaining catalytic element may have an adverse effect on the characteristics of a TFT. Therefore, it is required to reduce the concentration of the catalytic element in the semiconductor film. Hereinafter, a method of reducing the concentration of the catalytic element in the semiconductor film after the crystallization process will be described.

Figure 24D:
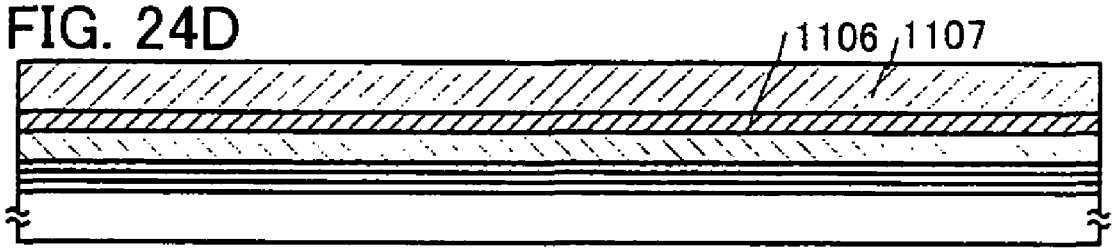

First, as shown in FIG. 24D, a thin layer 1106 is formed on the surface of the crystalline silicon film 1105. In the present specification, the thin layer 1106 formed on the crystalline silicon film 1105 is provided for the purpose of preventing the crystalline silicon film 1105 from being etched when gettering sites are removed later, and will be referred to as a barrier layer 1106.

The barrier layer 1106 is formed to have a thickness of about 1 to 10 nm. In a simple way, the crystalline silicon film 1105 may be treated with ozone water to form a chemical oxide as a barrier layer. Alternatively, even when the crystalline silicon film 1105 is treated with an aqueous solution in which a hydrogen peroxide solution is mixed with sulfuric acid, hydrochloric acid, nitric acid or the like, a chemical oxide is similarly formed. As another method, ozone may be generated by a plasma treatment in an oxygen atmosphere or irradiation with ultraviolet light in an atmosphere containing oxygen, thereby oxidizing the crystalline silicon film 1105. Alternatively, a thin oxide film is formed as a barrier layer 1106 by heating the crystalline silicon film 1105 at about 200° C. to 350° C. in a clean oven. Alternatively, an oxide film may be deposited to have a thickness of about 1 to 5 nm by plasma CVD, sputtering, or vapor deposition to form a barrier layer. In any case, a film may be used which allows the catalytic element to move to a gettering site during gettering, and prevents an etchant from penetrating the crystalline silicon film 1105 (i.e., protects the crystalline silicon film 1105 from an etchant) in the course of removing the gettering site. For example, a chemical oxide film formed by a treatment with ozone water, a silicon oxide film ($SiO_x$), or a porous film may be used.

Then, as a gettering site 1107, a second semiconductor film (typically, an amorphous silicon film) containing a rare gas element in a concentration of $1 \times 10^{20}/\text{cm}^3$ or more is formed to have a thickness of 25 to 250 nm on the barrier layer 1106 by sputtering. In order to increase a selection ratio of etching with respect to the crystalline silicon film 1105, it is preferable that the gettering site 1107 to be removed later is formed so as to have a low density.

The rare gas element itself is inactive in the semiconductor film, so that it will not have an adverse effect on the crystalline silicon film 1105. As the rare gas element, one or a plurality of kinds of elements selected from helium (He), neon (Ne), argon (Ar), krypton (Kr), and xenon (Xe) is used. The present invention is characterized in that these rare gas elements are used as an ion source for forming the gettering site, and a semiconductor film containing these elements is formed to obtain a gettering site.

In order to exactly achieve gettering, it is required to conduct a heat treatment later. The heat treatment is conducted by furnace annealing or RTA. In the case of conducting the furnace annealing, the heat treatment is conducted at 450° C. to 600° C. for 0.5 to 12 hours in a nitrogen atmosphere. In the case of using the RTA, a lamp light source for heating is lighted for 1 to 60 seconds (preferably, 30 to 60 seconds), and this cycle is repeated 1 to 10 times (preferably, 2 to 6 times). A light-emission intensity of the lamp light source is arbitrarily determined in such a manner that the semiconductor film can be heated rapidly to about 600° C. to 1000° C., preferably about 700° C. to 750° C.

Figure 24E:
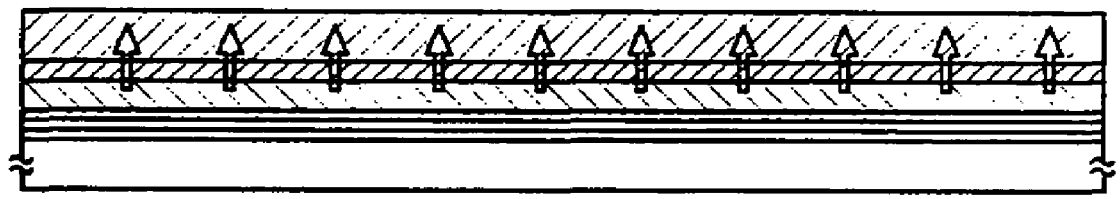

Due to gettering, a catalytic element in a region to be gettered (trapping site) is released by heat energy, and moves to a gettering site by diffusion. Therefore, getting depends upon a treatment temperature, and proceeds in a shorter period of time when a temperature is higher. According to the present invention, the distance in which a catalytic element moves during gettering is about the thickness of the semiconductor film, whereby gettering can be completed in a relatively short period of time (FIG. 24E).

Even due to the above-mentioned heat treatment, the semiconductor film 1107 containing a rare gas element in a concentration of $1\times10^9/cm^3$ to $1\times10^{21}/cm^3$, preferably $1\times10^{20}/cm^3$ to $1\times10^{21}/cm^3$, more preferably $5\times10^{20}/cm^3$ is not crystallized. The reason for this is considered as follows: a rare gas element remains in the semiconductor film 1107 without being released again even in a range of the above-mentioned treatment temperature, thereby inhibiting crystallization of the semiconductor film 1107.

After the gettering process, the gettering site 1107 is selectively etched to be removed. As an etching method, dry etching with $ClF_3$ without using plasma, or wet etching with an alkaline solution such as an aqueous solution containing hydrazine and tetraethylammonium hydroxide (($CH_3$)$_4$NOH) can be conducted. At this time, the barrier layer 1106 functions as an etching stopper. Furthermore, the barrier layer 1106 may be removed later with fluoric acid.

Figure 24F:
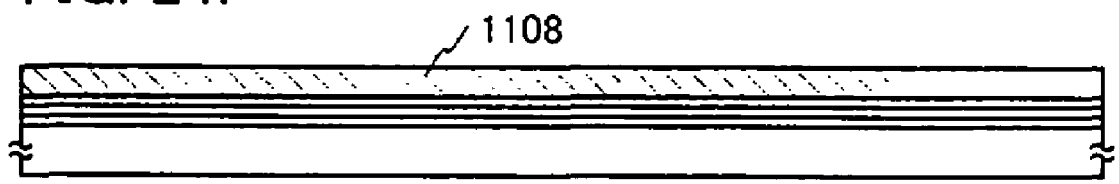

Thus, as shown in FIG. 24F, a crystalline silicon film 1108 with the concentration of a catalytic element reduced to $1\times10^{17}/cm^3$ or less can be obtained. The crystalline silicon film 1108 thus obtained is formed as crystal in a thin bar shape or in a thin flat bar shape due to the function of the catalytic element, and each crystal grows in a particular direction when seen macroscopically.

The present embodiment can be combined with Embodiment modes 1 and 2, and Embodiments 1 to 5.

Embodiment 6

Figure 17A:
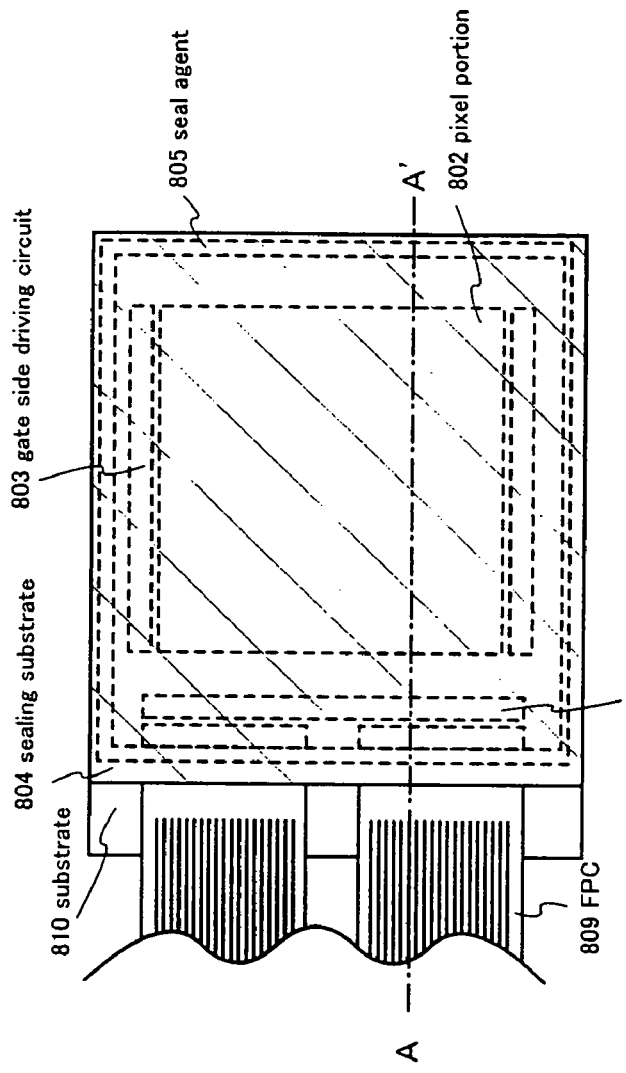
FIGS. 17A and 17B show an exemplary embodiment of the present invention.
Figure 17B:
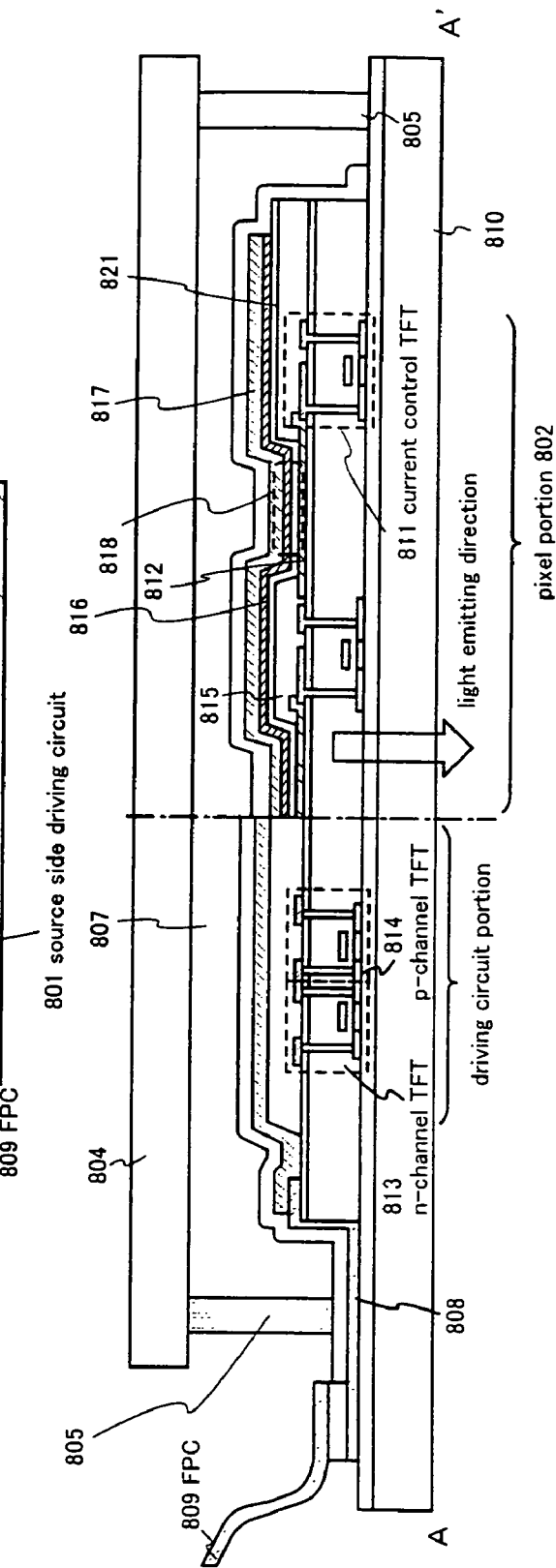

In this embodiment, the following will specifically describe a process in which the light-emitting panel produced by a combined manufacturing step of Embodiments 1 to 5 as illustrated in FIG. 10B is caused to be completed as a light-emitting device, referring to FIGS. 17A and 17B.

FIG. 17A is a top view of the light-emitting panel wherein the TFT substrate is airtightly sealed, and FIG. 17B is a sectional view taken on line A-A of FIG. 17A. Reference number 801 represents a source side driving circuit, which is illustrated by dot lines; reference number 802, a pixel portion; reference number 803, a gate side driving circuit: reference number 804, a-sealing substrate; and reference number 805, a sealing agent. The inside surround by the seal agent 805 is a space 807.

Through wirings (not illustrated) for transmitting signals inputted to the source side driving circuit 801 and the gate side driving circuit 803, video signals or clock signals are received from a flexible print circuit (FPC) 809, which is an external input terminal. The state that the FPC is connected to the light-emitting panel is shown herein. In the present specification, any module on which integrated circuits (ICs) are directly mounted through the FPC is referred to as a light-emitting device.

Referring to FIG. 17B, the following will describe the sectional structure of the light-emitting panel illustrated in FIG. 17A. The pixel portion 802 and a driving circuit portion are formed above a substrate 810. The pixel section 802 is composed of pixels, each of which includes a current control TFT 811 and an anode 812 connected electrically to drain of the current control TFT 811. The driving circuit portion is composed of a CMOS circuit wherein an n-channel TFT 813 and a p-channel TFT 814 are combined with each other.

Banks 815 are formed at both sides of each of the anodes 812. Thereafter, an insulating film 821, an organic compound layer 816 and cathodes 817 are formed on the anodes 812 to produce light-emitting elements 818.

The cathodes 817 function as a wiring common to all of the pixels, and are electrically connected to the FPC 809 through a connecting wiring 808.

The sealing substrate 804 made of glass is stuck to the substrate 810 with the sealing agent 805. As the sealing agent 805, an ultraviolet setting resin or thermosetting resin is preferably used. If necessary, a space composed of a resin film may be disposed in order to keep an interval between the sealing substrate 804 and the light-emitting elements 818. An inert gas such as nitrogen or rare gas is filled into the space 807 surrounded by the sealing agent 805. It is desired that the sealing agent 805 is made of a material whose permeability of water or oxygen is as small as possible.

By putting the light-emitting elements airtightly into the space 807 in the above-mentioned structure, the light-emitting elements can be completely shut off from the outside. As a result, it is possible to prevent the deterioration of the light-emitting elements by water or oxygen entering from the outside. Accordingly, a light-emitting device having high reliability can be yielded.

The structure of this embodiment can be implemented by combining the structure of embodiment modes 1, 2, and Embodiments 1 to 5 at will.

Embodiment 7

Figure 18A:
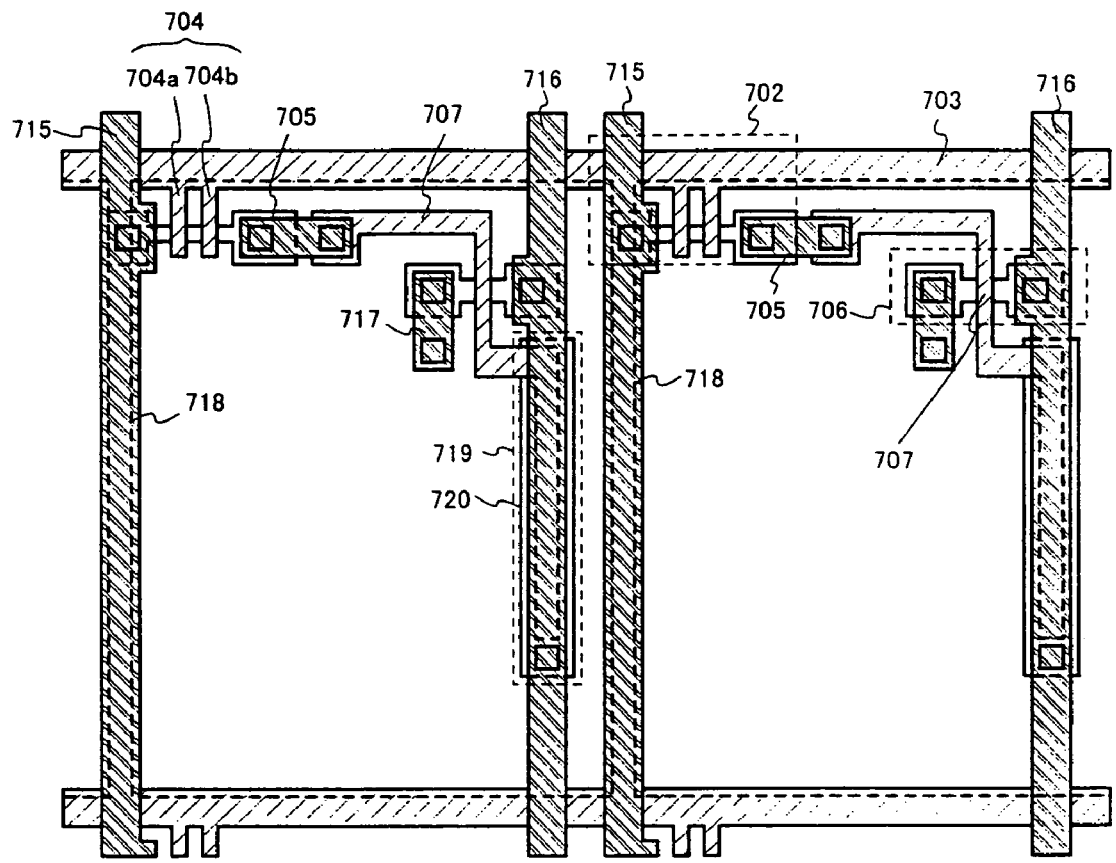
FIGS. 18A and 18B show an exemplary embodiment of the present invention.
Figure 18B:
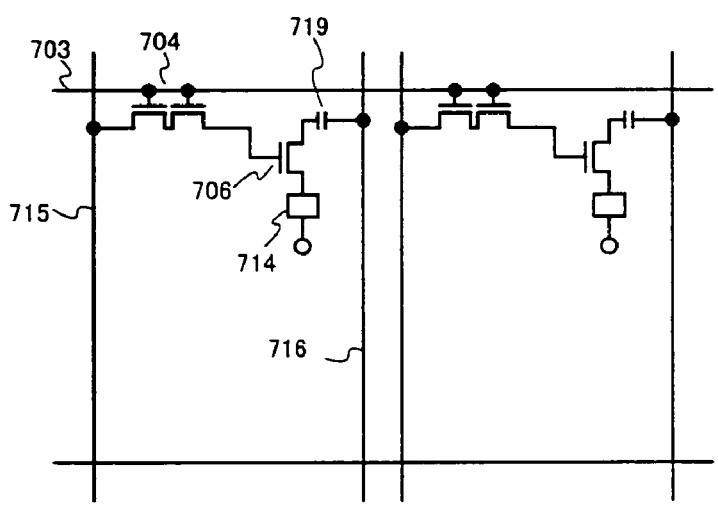

FIG. 18A more specifically illustrates the top face structure of the pixel portion of the light-emitting device produced using the present invention, and FIG. 18B illustrates a circuit diagram thereof. Referring to FIGS. 18A to 18B, a switching TFT 704 is composed of the switching (n-channel) TFT 1002 as illustrated in FIG. 10B. Accordingly, about the structure thereof, the description on the switching (n-channel) TFT 1002 should be referred to. A wiring 703 is a gate wiring for connecting gate electrodes 704a and 704b of the switching TFT 704 electrically with each other.

In this embodiment, a double gate structure, wherein two channel forming regions are formed is adopted. However, a single gate structure, wherein one channel forming region is formed, or a triple gate structure, wherein three channel forming regions are formed, may be adopted.

The source of the switching TFT 704 is connected to a source wiring 715, and the drain thereof is connected to a drain wiring 705. The drain wiring 705 is electrically connected to a gate electrode 707 of a current control TFT 706. The current control TFT 706 is composed of the current control (p-channel) TFT 1003 in FIG. 10B. Therefore, about the structure thereof, the description on the switching (p-channel) TFT 1003 should be referred to. In this embodiment, a single gate structure is adopted. However, a double gate structure or a triple gate structure may be adopted.

The source of the current control TFT 706 is electrically connected to a current supply line 716. The drain thereof is electrically connected to a drain wiring 717. The drain wiring 717 is electrically connected to an anode (pixel electrode) 718 illustrated by dot lines.

In this case, a retention storage capacitor (condenser) is formed in a region indicated by a reference number 719. The condenser 719 is formed by a semiconductor film 720 connected electrically to the current supply line 716, an insulating film (not illustrated) which is formed into the same layer as the gate insulating film, and the gate electrode 707. A capacitor composed of the gate electrode 707, a layer (not illustrated) that is formed into the same layer as the first interlayer insulating film, and the current supply line 716 may be used as a retention storage capacitor.

The structure of this embodiment can be implemented by combining the structure of Embodiment modes 1, 2, and Embodiments 1 to 6 at will.

Embodiment 8

Examples of electronic devices whose display unit uses the light-emitting device manufactured by using the present invention are: a video camera; a digital camera; a goggle type display (head mounted display); a navigation system; an audio reproducing device (car audio, an audio component, and the like); a laptop computer; a game machine; a portable information terminal (a mobile computer, a cellular phone, a portable game machine, an electronic book, etc.); and an image reproducing device (specifically, a device capable of processing data in a recording medium such as a digital versatile disk (DVD) and having a display device that can display the image of the data). The light-emitting device having a light-emitting element is desirable particularly for a portable information terminal since its screen is often viewed obliquely and is required to have a wide viewing angle. Specific example of the electronic devices are shown in FIGS. 19A to 19H.

Figure 19A:
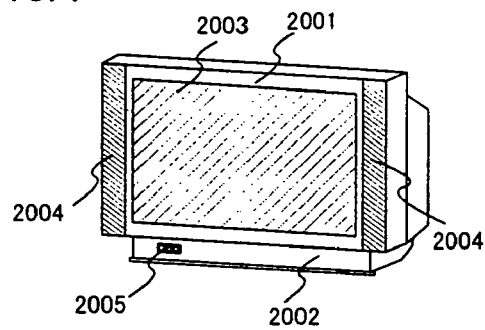
FIG. 19A to 19H show electric equipment using a light-emitting device manufactured according to the present invention in a display portion.

FIG. 19A shows a display device, which is composed of a casing 2001, a supporting base 2002, a display unit 2003, speaker units 2004, a video input terminal 2005, etc. The light-emitting device of the present invention can be used for the display unit 2003. The light-emitting device having a light-emitting element is self-luminous and does not need a backlight, so that it can make a thinner display unit than liquid crystal display devices can. The term display device includes every display device for displaying information such as one for a personal computer, one for receiving TV broadcasting, and one for advertisement.

Figure 19B:
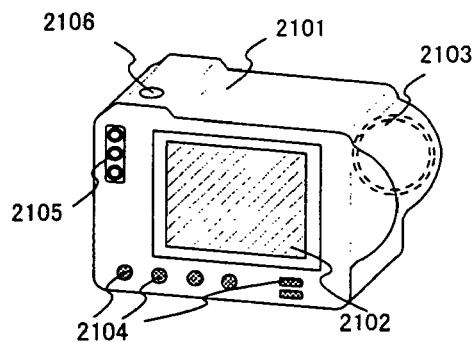

FIG. 19B shows a digital still camera, which is composed of a main body 2101, a display unit 2102, an image receiving unit 2103, operation keys 2104, an external connection port 2105, a shutter 2106, etc. The light-emitting device formed by using the present invention can be used to the display unit 2102.

Figure 19C:
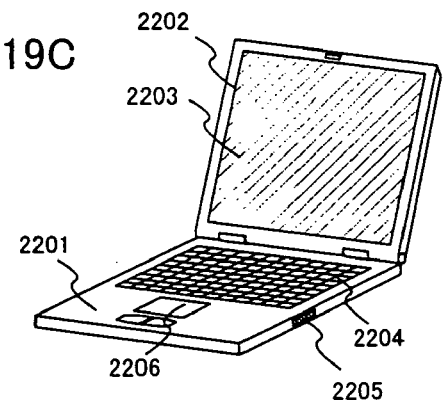

FIG. 19C shows a laptop computer, which is composed of a main body 2201, a casing 2202, a display unit 2203, a keyboard 2204, an external connection port 2205, a pointing mouse 2206, etc. The light-emitting device formed by using the present invention can be used to the display unit 2203.

Figure 19D:
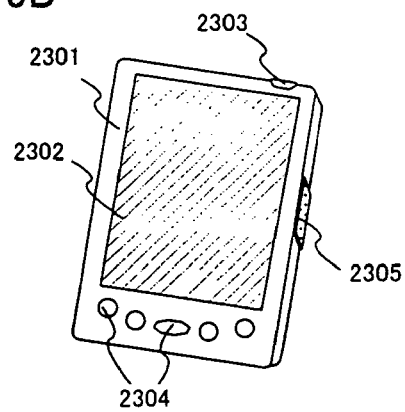

FIG. 19D shows a mobile computer, which is composed of a main body 2301, a display unit 2302, a switch 2303, operation keys 2304, an infrared ray port 2305. etc. The light-emitting device formed by using the present invention can be used to the display unit 2302.

Figure 19E:
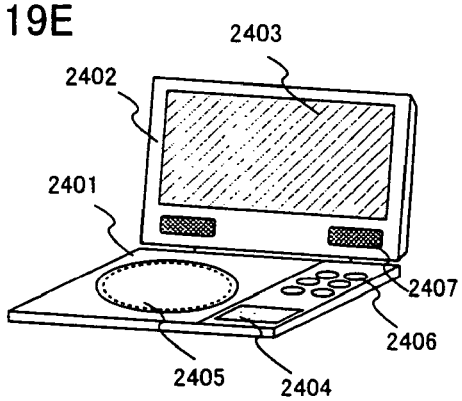

FIG. 19E shows a portable image reproducing device equipped with a recording medium (a DVD player, to be specific). The device is composed of a main body 2401, a casing 2402, a display unit A 2403, a display unit B 2404, a recording medium (DVD) reading unit 2405, operation keys 2406, speaker units 2407, etc. The display unit A 2403 mainly displays image information whereas the display unit B 2404 mainly displays text information. The portable image reproducing device is formed by using the light-emitting device of the present invention to the display units A 2403 and B 2404. The term image reproducing device equipped with a recording medium includes home game machines.

Figure 19F:
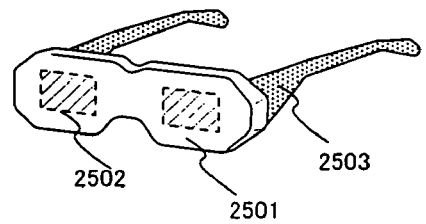

FIG. 19F shows a goggle type display (head mounted display), which is composed of a main body 2501, display units 2502, and arm units 2503. The light-emitting device formed by using the present invention can be used to the display unit 2502.

Figure 19G:
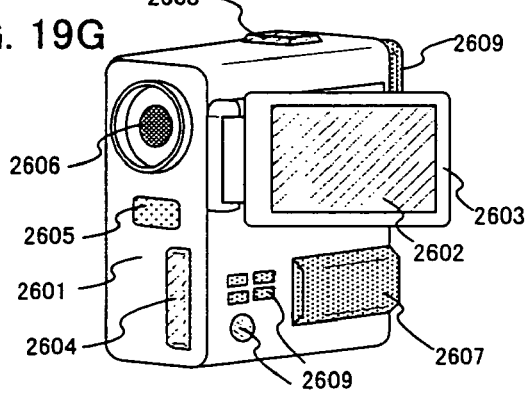

FIG. 19G shows a video camera, which is composed of a main body 2601, a display unit 2602, a casing 2603, an external connection port 2604, a remote control receiving unit 2605, an image receiving unit 2606, a battery 2607, an audio input unit 2608, operation keys 2609, etc. The light-emitting device formed by using the present invention can be used to the display unit 2602.

Figure 19H:
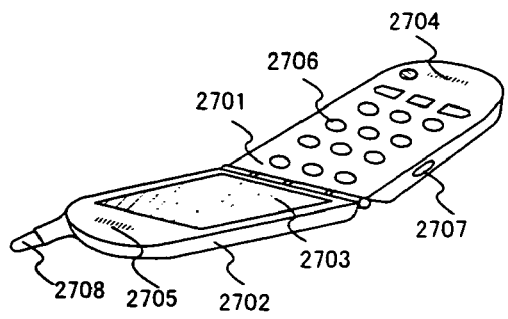

FIG. 19H shows a cellular phone, which is composed of a main body 2701, a casing 2702, a display unit 2703, an audio input unit 2704, an audio output unit 2705, operation keys 2706, an external connection port 2707, an antenna 2708, etc. The cellular phone is formed by using the light-emitting device of the present invention to the display unit 2703. If the display unit 2703 displays white characters on a black background, power consumption of the cellular phone can be reduced.

If the luminance of light emitted from organic materials is increased in future, the light-emitting device having an organic element can be used also in a front or rear projector in which light bearing outputted image information is magnified by a lens or the like to be projected on a screen.

The electronic device given in the above often displays information distributed through electronic communication lines such as Internet and CATV (cable television), especially, animation information with increasing frequency. The light-emitting device having a light-emitting element is suitable for displaying animation information since organic materials have fast response speed.

In the light-emitting device, portions that emit light consume power. Therefore, it is desirable to display information such that as small portions as possible emits light. Accordingly, if the light-emitting device is used for a display unit that mainly displays text information such as a portable information terminal, in particular, a cellular phone, and an audio reproducing device, it is desirable to assign light-emitting portions to display text information while portions that do not emit light serve as the background.

As described above, the application range of the light-emitting device to which the present invention is applied is very wide and electronic devices of every field can employ the device. The electronic devices in this embodiment can be completed by using the light-emitting device manufactured by implementing the method shown in and Embodiment modes 1, 2, and Embodiments 1 to 6.

The present invention includes an inspection process using an inspection apparatus and an inspection method applicable to not only a light-emitting device (EL display) having a light-emitting element, but also all the electric equipment using a semiconductor element that uses semiconductor characteristics such as a liquid crystal display device (e.g., a transistor, in particular, a field-effect transistor; typically, a MOS transistor and a TFT).

According to the inspection process included in the method of manufacturing a semiconductor device of the present invention, a driving power source and a driving signal can be supplied to a TFT substrate in a non-contact manner. Therefore, the problems involved in the conventional contact-type inspection method, such as adhesion of dust to a TFT substrate and damage to a TFT substrate by an inspection apparatus can be overcome.

Furthermore, a secondary coil, a rectifier circuit, and a waveform shaping circuit on an array substrate used in the inspection process included in the present invention may be formed in accordance with the manufacturing processes of a TFT. Therefore, it is not required to increase the number of processes in manufacturing a TFT substrate.

In particular, in the case of manufacturing an EL display, a light-emitting element only needs to be produced after the quality of a TFT substrate is determined. Therefore, it is not required to form a light-emitting element using an expensive material in a TFT substrate unsuitable for a product, which can eliminate wastes and reduce a manufacturing cost.

What is claimed is:

1. A method of manufacturing a semiconductor device comprising:
   providing a semiconductor device comprising a plurality of thin film transistors over a substrate;
   providing a secondary coil over said substrate;
   providing a waveform shaping circuit and a rectifier circuit over said substrate;
   keeping an interval between a primary coil and said secondary coil of said substrate;
   applying a voltage between two terminals of said primary coil;
   inducing an AC voltage in said secondary coil by electromagnetic induction;
   rectifying said AC voltage to form pulsating voltages with different phases by said rectifier circuit;
   forming a driving signal by said waveform shaping circuit and said rectifier circuit from said AC voltage;
   smoothing said pulsating voltages to be used as a power source voltage after rectifying said AC voltage;
   supplying said driving signal and said power source voltage to said semiconductor device to drive said semiconductor device;
   detecting an electric field created by said semiconductor device as a result of supplying said driving signal thereto in order to decide whether said semiconductor device correctly operates or not, and
   wherein said electric field is measured by using an antenna,
   wherein each of said pulsating voltages after rectifying said AC voltage, has 0 or a value having one polarity on a semi-period basis, and
   wherein said pulsating voltages with different phases are combined with each other to generate said power source voltage after rectifying said AC voltage.

2. A method of manufacturing a semiconductor device comprising:
   providing a semiconductor device comprising a plurality of thin film transistors over a substrate;
   providing a secondary coil over said substrate;
   providing a rectifier circuit over said substrate;
   inducing an AC voltage in said secondary coil by electromagnetic induction;
   rectifying said AC voltage to form pulsating voltages with different phases by said rectifier circuit;
   forming a driving signal by said rectifier circuit from said AC voltage;
   smoothing said pulsating voltages to be used as a power source voltage after rectifying said AC voltage;
   supplying said driving signal and said power source voltage to said semiconductor device to drive said semiconductor device;
   detecting an electric field created by said semiconductor device as a result of supplying said driving signal thereto in order to decide whether said semiconductor device correctly operates or not,
   wherein each of said pulsating voltages after rectifying said AC voltage, has 0 or a value having one polarity on a semi-period basis, and
   wherein said pulsating voltages with different phases are combined with each other to generate said power source voltage after rectifying said AC voltage.

3. A method of manufacturing a semiconductor device comprising:
   providing a semiconductor device comprising a plurality of semiconductor elements arranged in a matrix over a substrate;
   providing a secondary coil over said substrate;
   providing a waveform shaping circuit and a rectifier circuit over said substrate;
   keeping an interval between a primary coil and said secondary coil of said substrate;
   applying a voltage between two terminals of said primary coil;
   inducing an AC voltage in said secondary coil by electromagnetic induction;
   rectifying said AC voltage to form pulsating voltages with different phases by said rectifier circuit;
   forming a driving signal by said waveform shaping circuit and said rectifier circuit from said AC voltage;
   smoothing said pulsating voltages to be used as a power source voltage after rectifying said AC voltage;
   supplying said driving signal to said semiconductor device to drive said semiconductor device;
   detecting a defect in said plurality of semiconductor elements by observing an electric field generated at each of said plurality of semiconductor elements,
   wherein said electric field is measured by using an antenna,
   wherein each of said pulsating voltages after rectifying said AC voltage, has 0 or a value having one polarity on a semi-period basis, and
   wherein pulsating voltages with different phases are combined with each other to generate said power source voltage after rectifying said AC voltage.

4. A method of manufacturing a semiconductor device comprising:
- providing a semiconductor device comprising a plurality of semiconductor elements arranged in a matrix over a substrate;
- providing a secondary coil over said substrate;
- providing a rectifier circuit over said substrate;
- inducing an AC voltage in said secondary coil by electromagnetic induction;
- rectifying said AC voltage to form pulsating voltages with different phases by said rectifier circuit;
- forming a driving signal by said rectifier circuit from said AC voltage;
- smoothing said pulsating voltages to be used as a power source voltage after rectifying said AC voltage;
- supplying said driving signal and said power source voltage to said semiconductor device to drive said semiconductor device;
- detecting a defect in said plurality of semiconductor elements by observing an electric field generated at each of said plurality of semiconductor elements,
- wherein each of said pulsating voltages after rectifying said AC voltage, has 0 or a value having one polarity on a semi-period basis, and
- wherein said pulsating voltages with different phases are combined with each other to generate said power source voltage after rectifying said AC voltage.

5. The method according to claim 2 further comprising keeping an interval between a primary coil and said secondary coil of said substrate, and
- applying a voltage between two terminals of said primary coil.

6. The method according to claim 4 further comprising keeping an interval between a primary coil and said secondary coil of said substrate, and
- applying a voltage between two terminals of said primary coil.

7. The method according to claim 2, wherein said electric field is measured by using an antenna.

8. The method according to claim 4, wherein said electric field is measured by using an antenna.

9. The method according to claim 1, wherein said antennas has a measurement frequency band of 1 MHz to 1 GHz.

10. The method according to claim 3, wherein said antennas has a measurement frequency band of 1 MHz to 1 GHz.

11. The method according to claim 1 further comprising analyzing detected information by an image processing apparatus.

12. The method according to claim 2 further comprising analyzing detected information by an image processing apparatus.

13. The method according to claim 3 further comprising analyzing detected information by an image processing apparatus.

14. The method according to claim 4 further comprising analyzing detected information by an image processing apparatus.

15. The method according to claim 1 further comprising electrically separating said plurality of semiconductor elements from the at least one secondary coil.

16. The method according to claim 2 further comprising electrically separating said plurality of semiconductor elements from the at least one secondary coil.

17. The method according to claim 3 further comprising electrically separating said plurality of semiconductor elements from the at least one secondary coil.

18. The method according to claim 4 further comprising electrically separating said plurality of semiconductor elements from the at least one secondary coil.

19. The method according to claim 1, wherein said waveform shaping circuit is electrically connected with secondary coils over said substrate.

20. The method according to claim 2, wherein said rectifier circuit is electrically connected with secondary coils over said substrate.

21. The method according to claim 3, wherein said waveform shaping circuit is electrically connected with secondary coils over said substrate.

22. The method according to claim 4, wherein said rectifier circuit is electrically connected with secondary coils over said substrate.

23. The method according to claim 1, further comprising electrically connecting said plurality of secondary coil with said waveform shaping circuit or said rectifier circuit.

24. The method according to claim 2, further comprising electrically connecting said plurality of secondary coil with said waveform shaping circuit or said rectifier circuit.

25. The method according to claim 3, further comprising electrically connecting said plurality of secondary coil with said waveform shaping circuit or said rectifier circuit.

26. The method according to claim 4, further comprising electrically connecting said plurality of secondary coil with said waveform shaping circuit or said rectifier circuit.

27. The method according to claim 1, wherein said substrate is a plastic substrate.

28. The method according to claim 2, wherein said substrate is a plastic substrate.

29. The method according to claim 3, wherein said substrate is a plastic substrate.

30. The method according to claim 4, wherein said substrate is a plastic substrate.

* * * * *